(12) United States Patent
Kikuchi et al.

(10) Patent No.: US 12,108,690 B2
(45) Date of Patent: Oct. 1, 2024

(54) QUANTUM DEVICE

(71) Applicant: NEC Corporation, Tokyo (JP)

(72) Inventors: Katsumi Kikuchi, Tokyo (JP); Akira Miyata, Tokyo (JP); Suguru Watanabe, Tokyo (JP); Takanori Nishi, Tokyo (JP); Hideyuki Satou, Tokyo (JP); Kenji Nanba, Tokyo (JP); Ayami Yamaguchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 455 days.

(21) Appl. No.: 17/347,784

(22) Filed: Jun. 15, 2021

(65) Prior Publication Data

US 2021/0399196 A1 Dec. 23, 2021

(30) Foreign Application Priority Data

Jun. 19, 2020 (JP) .................................. 2020-106148

(51) Int. Cl.
*H01L 39/04* (2006.01)
*H01R 12/71* (2011.01)
*H10N 60/81* (2023.01)
*H01R 13/24* (2006.01)

(52) U.S. Cl.
CPC .......... *H10N 60/815* (2023.02); *H01R 12/714* (2013.01); *H01R 13/24* (2013.01)

(58) Field of Classification Search
CPC ................. H10N 60/815; H10N 69/00; H10N 60/12–126; H10N 99/05; H01R 12/714; H01R 13/24; H01R 12/7082; H01L 23/32; H01L 23/49827; H01L 24/10; H01L 2224/16; H01L 27/18; H01L 23/49822; H01L 23/5383; G06N 10/40
See application file for complete search history.

(56) References Cited

U.S. PATENT DOCUMENTS 9,836,699 B1 12/2017 Rigetti et al.
2021/0305165 A1* 9/2021 Shao .................. H01L 24/13

FOREIGN PATENT DOCUMENTS

JP 2002367748 A * 12/2002
WO 2018/212041 A1 11/2018
WO 2019/132963 A1 7/2019

OTHER PUBLICATIONS

JP Office Action for JP Application No. 2020-106148, mailed on Mar. 26, 2024 with English Translation.

* cited by examiner

*Primary Examiner* — Shahed Ahmed
(74) *Attorney, Agent, or Firm* — Sughrue Mion, PLLC

(57) ABSTRACT

A quantum device capable of securing terminals for external connection is provided. A quantum device according to an example embodiment includes a quantum chip 10, an interposer 20 on which the quantum chip 10 is mounted, and a socket 40 disposed so as to be opposed to the interposer 20, the socket 40 comprising a movable pin 47 and a housing 45 supporting the movable pin 47, in which at least one end of the movable pin 47, which includes the one end and the other end opposite to the one end, is movable relative to the housing 45, the one end being in electrical contact with a terminal of the interposer 20, and the other end is in an electrical contact with a terminal of a board 50 on which a connector 51 is formed, the connector 51 being configured to serve as an external input/output.

19 Claims, 26 Drawing Sheets

QUANTUM DEVICE

INCORPORATION BY REFERENCE

This application is based upon and claims the benefit of priority from Japanese patent application No. 2020-106148, filed on Jun. 19, 2021, the disclosure of which is incorporated herein in its entirety by reference.

TECHNICAL FIELD

The present disclosure relates to a quantum device.

BACKGROUND ART

International Patent Publication No. WO2018/212041 discloses a quantum device in which a quantum chip which uses its quantum state is mounted on an interposer by using a flip-chip mounting technique. In order to use such a quantum device in a superconducting state, it is necessary to cool the quantum device to an extremely low temperature.

When a quantum chip is cooled to an extremely low temperature, there is a risk that a contact with a terminal for external connection is disconnected (e.g., broken) due to a stress and a strain caused by the change in volume during the cooling process. Further, in the above-described quantum device, when one of the surfaces of the interposer is used for cooling that is performed using a sample stage, the number of terminals for external connection is limited.

SUMMARY

The present disclosure has been made to solve above-described problem, and an object thereof is to provide a quantum device capable of preventing terminals for external connection from being disconnected (e.g., from being broken) and thereby securing the terminals for external connection.

In a first example aspect, a quantum device includes: a quantum chip in which a quantum bit is formed; an interposer on which the quantum chip is mounted; and a socket disposed so as to be opposed to the interposer, the socket including a movable pin and a housing supporting the movable pin, in which at least one end of the movable pin, which includes the one end and the other end opposite to the one end, is movable relative to the housing, the one end being in electrical contact with a terminal of the interposer, and the other end is in an electrical contact with a terminal of a board on which a connector is formed, the connector being configured to serve as an external input/output.

Further, in another example aspect, a quantum device includes: a quantum chip in which a quantum bit is formed; an interposer on which the quantum chip is mounted; and a socket disposed so as to be opposed to the interposer, the socket including a movable pin and a housing supporting the movable pin, the movable pin being in electrical contact with a terminal of the interposer, in which a part of at least one of the quantum chip, the interposer, and the socket is in contact with a sample stage having a cooling function.

BRIEF DESCRIPTION OF DRAWINGS

The above and other aspects, features and advantages of the present disclosure will become more apparent from the following description of certain example embodiments when taken in conjunction with the accompanying drawings, in which.

EXAMPLE EMBODIMENTS

Figure 1:
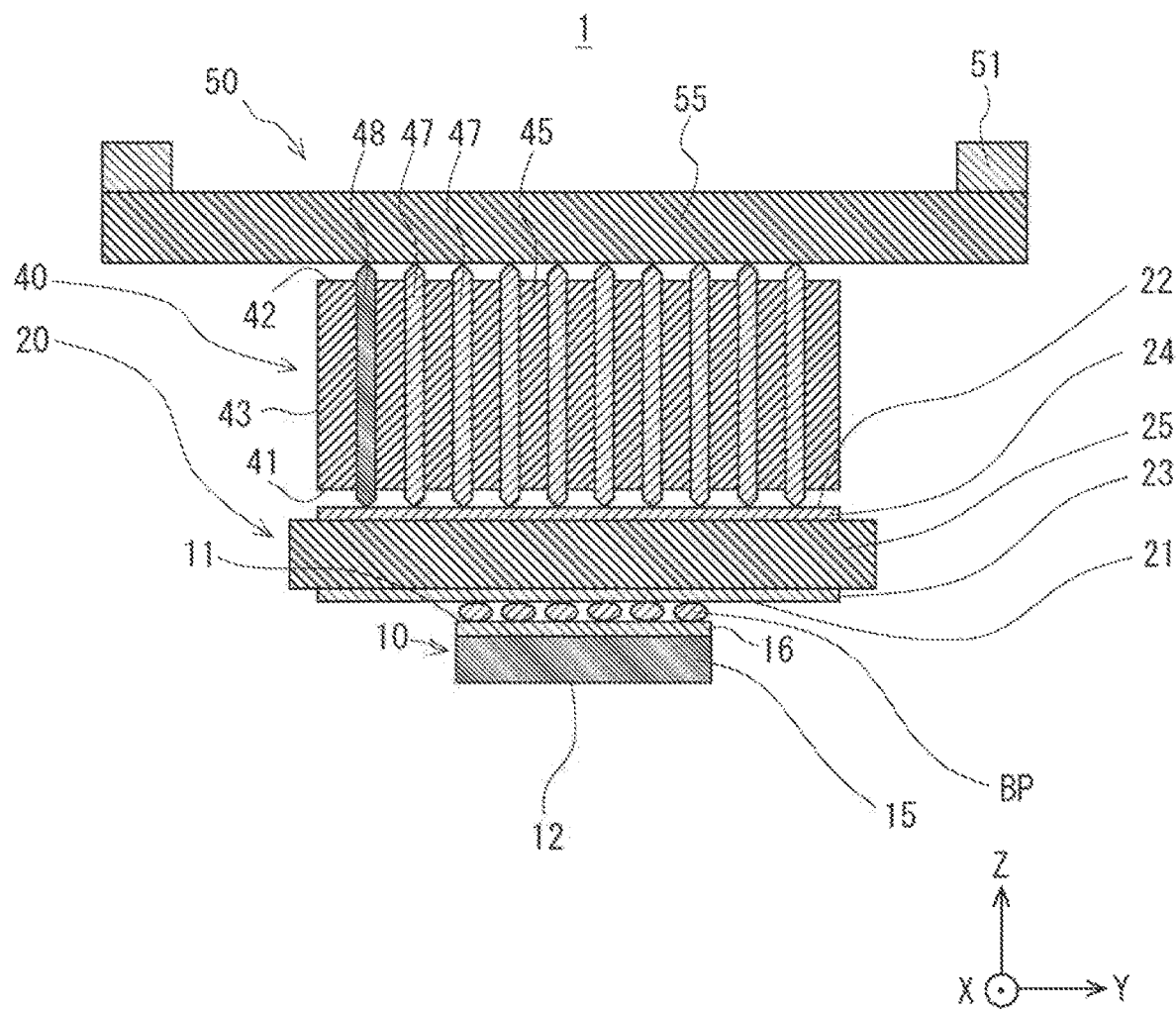
FIG. 1 is a cross-sectional view showing an example of a quantum device according to a first example embodiment.

Quantum computing is a technical field in which data is manipulated by using a quantum mechanical phenomenon (a quantum bit). The quantum mechanical phenomenon is, for example, superposition of a plurality of states (i.e., a quantum variable simultaneously assumes a plurality of different states) or entanglement (i.e., a state in which a plurality of quantum variables are related to each other in terms of space or time). In a quantum chip, a quantum circuit that generates a quantum bit is provided. The following description and the drawings are partially omitted and simplified as appropriate for clarifying the explanation. Further, the same elements are denoted by the same reference numerals (or symbols) throughout the drawings, and redundant descriptions thereof are omitted as appropriate.

First Example Embodiment

Figure 2:
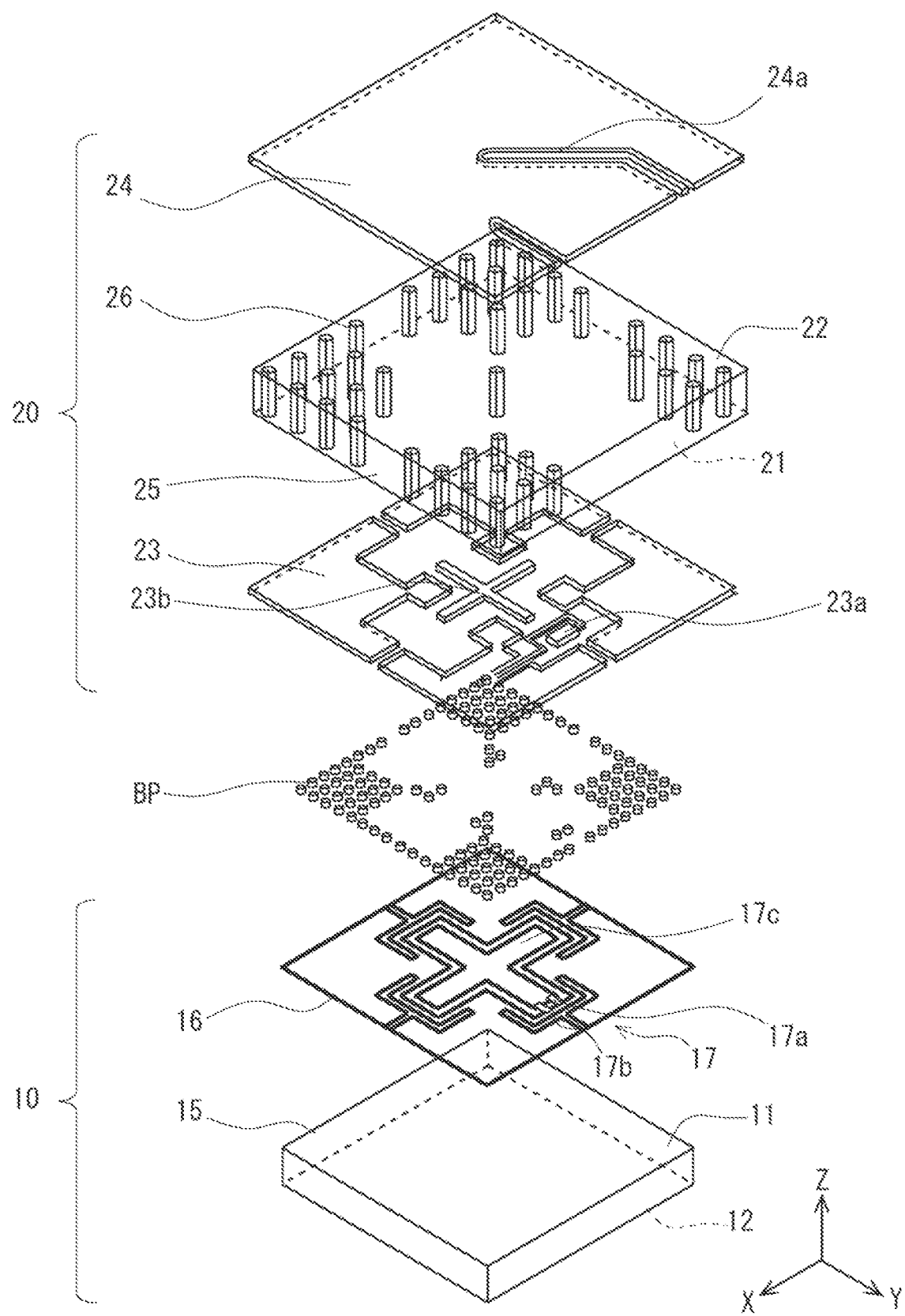
FIG. 2 is an exploded perspective view showing an example of a quantum chip and an interposer in the quantum device according to the first example embodiment.

A quantum device according to a first example embodiment will be described. FIG. 1 is a cross-sectional view showing an example of a quantum device according to the first example embodiment. FIG. 2 is an exploded perspective view showing an example of a quantum chip and an interposer in the quantum device according to the first example embodiment. As shown in FIGS. 1 and 2, the quantum device 1 includes a quantum chip 10, an interposer 20, and a socket 40.

The quantum chip 10 includes a chip substrate 15 and a wiring layer 16. The chip substrate 15 contains, for example, silicon (Si). Note that the chip substrate 15 is not limited to those containing silicon and may include those containing other electronic materials such as sapphire or a compound semiconductor material (Groups IV, III-V, and II-VI) as long as the quantum chip 10 can form a quantum bit. Further, the material is preferably a single-crystalline material, but it may be a polycrystalline material or an amorphous material.

The chip substrate 15 has, for example, a plate-like shape, and has one plate surface and the other plate surface opposite to the one plate surface. The one plate surface is called a first surface 11, and the other plate surface is called a second surface 12. Therefore, the quantum chip 10 and the chip substrate 15 have the first surface 11 and the second surface 12. For example, both the first and second surfaces 11 and 12 have a rectangular shape. In the quantum device 1, the first surface 11 faces the interposer 20 side. The quantum chip 10 is mounted on the interposer 20 so that the first surface 11 is opposed to the interposer 20 with bumps BP interposed therebetween.

The wiring layer 16 is disposed on the first surface 11 side of the chip substrate 15. The wiring layer 16 contains, for example, a superconducting material such as niobium (Nb). Note that the superconducting material used in the wiring layer 16 is not limited to niobium (Nb). For example, the superconducting material may contain niobium nitride, aluminum (Al), indium (In), lead (Pb), tin (Sn), rhenium (Re), palladium (Pd), titanium (Ti), or an alloy containing at least one of them.

The wiring layer 16 includes a quantum circuit 17. A resonator 17c including a loop circuit 17b in which pieces of a superconducting material are connected to each other in a circular manner by Josephson junctions 17a is formed in the quantum circuit 17. The material used for the Josephson junctions is preferably aluminum (Al), but may be other superconducting materials. The quantum circuit 17 performs a process using the resonator 17c in a superconducting state in which the quantum chip is in a quantum state. As described above, the quantum chip 10 includes the quantum circuit 17 and performs a process under a quantum state.

The wiring layer 16 is mounted (e.g., formed) on the interposer 20 with the bumps BP interposed therebetween. Therefore, the quantum chip 10 is mounted on the interposer 20 by using a flip-chip mounting technique.

The bumps BP may contain the above-described superconducting material. The bumps BP may contain the same superconducting material as that contained in the wiring layer 16, and/or a superconducting material different from that contained in the wiring layer 16. Further, when the bump BP includes a plurality of metal layers, at least one of the layers preferably includes a superconducting material. The bump BP may have a layered structure including Nb (the wiring surface of the quantum chip 10)/In (Sn, Pb, or an alloy containing at least one of them)/Ti/Nb (the wiring surface of the interposer 20)/Cu, or a layered structure including Nb (the wiring surface of the quantum chip 10)/Nb (the wiring surface of the interposer 20)/Cu. Alternatively, the bump BP may have a layered structure including Nb (the wiring surface of the quantum chip 10)/In (Sn, Pb, or an alloy containing at least one of them)/Ta (the wiring surface of the interposer 20)/Cu. Further, in the case where the bump BP contains Al and In, TiN may be used for a barrier layer in order to prevent Al and In from forming an alloy thereof. In such a case, the bump BP may have a layered structure including Al (the wiring surface of the quantum chip 10)/Ti/TiN/In (Sn, Pb, or an alloy containing at least one of them)/TiN/Ti/Al (the wiring surface of the interposer 20)/Cu. Note that Ti is an adhesion layer. The flip-chip connection is preferably Nb (the wiring of the quantum chip 10)/In/Ti/Nb (the wiring surface of the interposer 20)/Cu, or Nb (the wiring of the quantum chip 10)/Nb (wiring surface of the interposer 20)/Cu. Copper (Cu) is preferably added to an interposer wiring layer 23 having a thickness of 2 μm in a range of thickness from 2 μm to 10 μm, and bumps each of which has a diameter of 100 μm are preferably provided.

The interposer 20 includes interposer wiring layers 23 and 24, an interposer substrate 25, and through vias (hereafter referred to as TVs 26) (in this specification, the term "through via" also means a conductive material with which the through via is filled). Note that, in FIG. 1, illustration of the TVs 26 is omitted in order to prevent the drawing from becoming too complicated.

The interposer substrate 25 is, for example, a plate-like substrate. The interposer substrate 25 contains, for example, silicon (Si). Note that the interposer substrate 25 is not limited to those containing silicon and may include those containing other electronic materials such as sapphire or a compound semiconductor material (Groups IV, III-V, and II-VI) as long as the quantum chip 10 can mounted thereon. The surface of the interposer substrate 25 is preferably covered by a silicon oxide film (such as a $SiO_2$ film or a TEOS film). The interposer substrate 25 and the interposer 20 have a mounting surface 21 on which the quantum chip 10 is mounted, and an opposite surface 22 opposite to the mounting surface 21.

Note that an XYZ-orthogonal coordinate system is used for facilitating the explanation of the quantum device 1. A plane parallel to the opposite surface 22 of the interposer 20 is defined as an XY-plane, and a direction perpendicular to the opposite surface 22 is defined as a Z-axis direction. The Z-axis positive direction is referred to as an upward direction and the Z-axis negative direction is referred to as a downward direction. Note that the terms "upward" and "downward" are used just for the explanatory purpose, and do not indicate the directions in which the actual quantum device 1 is positioned when it is used.

For example, the quantum chip 10 is disposed on the Z-axis negative direction side of the interposer 20. The wiring layer 16 disposed on the X-axis positive direction side of the quantum chip 10 and the mounting surface 21 disposed on the Z-axis negative direction side of the interposer 20 are connected to each other through the bumps BP.

The interposer wiring layer 23 is formed on the mounting surface 21 side of the interposer 20, i.e., on the Z-axis negative direction side of the interposer 20. The interposer wiring layer 23 includes the above-described superconducting material. The interposer wiring layer 23 may contain the same superconducting material as that contained in the wiring layer 16, and/or a superconducting material different from that contained in the wiring layer 16. For example, the interposer wiring layer 23 preferably contains, as viewed from the surface toward the interposer substrate 25, Nb (having a thickness of 0.1 μm), Cu (having a thickness of 2 μm), and Ti in this order. For example, in the case where the interposer substrate 25 contains silicon, the mounting surface 21 side of the interposer 20 preferably has a structure expressed as Nb/Cu/Ti/SiO$_2$/Si (the interposer substrate 25). The interposer wiring layer 23 is connected to the wiring layer 16 of the quantum chip 10 with the bumps BP interposed therebetween.

The interposer wiring layer 23 may be a single layer or composed of a plurality of layers. The interposer wiring layer 23 may include a magnetic-field applying circuit 23a and a reading part 23b. The magnetic-field applying circuit 23a generates a magnetic field applied to the loop circuit 17b. It is possible to make the quantum circuit 17 function as a transmitter by applying a magnetic field to the loop circuit 17b. The reading part 23b reads information from the quantum circuit 17.

The interposer wiring layer 24 is formed on the opposite surface 22 side of the interposer substrate 25, i.e., on the Z-axis positive direction side of the interposer 20. The interposer wiring layer 24 may contain the above-mentioned superconducting material. The interposer wiring layer 24 may contain the same superconducting material as those contained in the wiring layer 16 and the interposer wiring layer 23, and/or a superconducting material different from those contained in the wiring layer 16 and the interposer wiring layer 23. Further, the interposer wiring layer 24 may contain a normal conductive material. The normal conductive material is, for example, copper (Cu), silver (Ag), gold (Au), platinum (Pt), or an alloy containing at least one of them. For example, the interposer wiring layer 24 preferably contains, as viewed from the surface toward the interposer substrate 25, Cu and Ti in this order. For example, in the case where the interposer substrate 25 contains silicon, the opposite surface 22 side of the interposer 20 preferably has a structure expressed as Cu/Ti/SiO$_2$/Si (the interposer substrate 25).

The interposer wiring layer 24 may be a single layer or composed of a plurality of layers. The interposer wiring layer 24 includes a terminal 24a through which information is acquired from the quantum chip 10 through the TVs 26 (i.e., through the conductive materials with which the TVs 26 are filled). Although only one terminal 24a is shown in FIG. 2, a plurality of terminals 24a may be formed in the interposer wiring layer 24. In the quantum device 1 according to this example embodiment, it is possible to make full use of the opposite surface 22 for the terminal(s) 24a through which information is acquired.

The TVs 26 extends from the mounting surface 21 side of the interposer substrate 25 to the opposite surface 22 side thereof. The interposer wiring layers 23 and 24 are connected to each other through the TVs 26.

The TVs 26 (i.e., the conductive materials with which the TVs 26 are filled) may contain the superconducting material described above. The TVs 26 may contain the same superconducting material as that contained in the wiring layer 16 and the like, and/or a superconducting material different from that contained in the wiring layer 16 and the like. Further, the TVs 26 may contain the above-described normal conductive material. The TVs 26 may contain the same normal conductive material as that contained in the interposer wiring layer 24, and/or a normal conductive material different from that contained in the interposer wiring layer 24. For example, each of the TVs 26 may be formed by forming $SiO_2$ (e.g., a thermal oxide film) on the side wall of a through hole having a diameter of 50 μm and filling the through hole with Cu while using Ti as an adhesion layer.

The socket 40 is disposed so as to be opposed to the interposer 20. For example, in this example embodiment, the socket 40 is disposed so as to be opposed to the opposite surface 22 of the interposer 20. The socket 40 includes a housing 45 and movable pins 47. Note that, in FIG. 1, some reference numerals (or symbols) are omitted in order to prevent the drawing from becoming too complicated.

The housing 45 includes one end surface 41 and the other end surface 42 opposite to the one end surface 41. Further, the housing 45 includes a side surface 43 that connects the peripheral edge of the one end surface 41 to the peripheral edge of the other end surface 42. For example, the one end surface 41 faces the interposer 20 side and faces downward, and the other end surface 42 faces upward. The housing 45 holds the movable pins 47. The housing 45 may hold a plurality of movable pins 47.

The housing 45 preferably contains an insulating material. At least a part of the housing 45 that is in contact with the movable pins 47 contains an insulating material. Further, the housing 45 preferably contains a non-magnetic material. Further, the housing 45 preferably contains a material having a thermal expansion coefficient equivalent to that of the interposer 20.

The housing 45 may contain a composite material that has a low linear thermal expansion coefficient, and contains aluminum oxide ($Al_2O_3$, also called alumina), mica-based machinable ceramic, aluminum nitride (AlN), zirconia ($ZrO_2$), MACOR-based machinable ceramic, glass, a resin, and a silica filler, or may contain a superconducting material as long as insulation from the movable pins 47 can be ensured.

The movable pins 47 are held by the housing 45. Each of the movable pins 47 has one end and the other end opposite to the one end. The movable pin 47 extends in the Z-axis direction, and the one end of the movable pin 47 faces downward and the other end thereof faces upward. Therefore, the one ends of the movable pins 47 protrude from the one end surface 41 of the housing 45. For example, the one ends of the movable pins 47 are in electrical contact with the terminal 24a of the interposer 20. The other ends of the movable pins 47 protrude from the other end surface 42 and are in electrical contact with the terminal of the board 50. As described above, the housing 45 includes the one end surface 41 from which the one ends of the movable pins 47 protrude, and the other end surface 42 from which the other ends of the movable pins 47 protrude. Although a space is formed between the one end surface 41 of the housing 45 and the interposer 20 in FIG. 1, no space may be formed between them as long as the one ends of the movable pins 47 can be in contact with the terminal 24a. Similarly, although a space is formed between the other end surface 42 of the housing 45 and the board 50, no space may be formed between them as long as the other ends of the movable pins 47 can be in contact with the terminal of the board 50.

The one ends and the other ends of the movable pins 47 are connected to their corresponding components in a conductive state with elastic means, such as a coil spring and a leaf spring, interposed therebetween. Regarding the one end and the other end of each movable pin 47, at least the one end of the movable pin 47, which is in electrical contact with the terminal of the interposer 20, is movable relative to the housing 45. The other end of the movable pin 47 may also be movable relative to the housing 45. The other end of the movable pin 47 is in electrical contact with, for example, the terminal of the board 50 on which a connector 51 that serves as an external input/output is formed.

The movable pins 47 may contain a superconducting material and/or a normal conductive material. The movable pins 47 may contain the same superconducting material as that contained in the wiring layer 16 and the like, and/or a superconducting material different from that contained in the wiring layer 16 and the like. Further, the movable pins 47 may contain the same normal conductive material as that contained in the interposer wiring layer 24, and/or a normal conductive material different from that contained in the interposer wiring layer 24. The movable pins 47 are preferably made of a non-magnetic material. The movable pins 47 preferably contain, for example, a palladium alloy, a gold alloy, beryllium copper (BeCu), gold (i.e., plated with gold), niobium (Nb), niobium titanium (Nb—Ti), or titanium (Ti).

The socket 40 may include a positioning pin 48. The positioning pin 48 is a pin for determining the position of the socket 40. The positioning pin 48 is held by the housing 45. The positioning pin 48 includes, for example, one end protruding from the one end surface 41. The one end of the positioning pin 48 is brought into contact with a predetermined place on the opposite surface 22 of the interposer 20, so that the position of the socket 40 is determined. Note that a hole may be formed in the opposite surface 22 of the interposer 20 and the positioning pin 48 may be inserted into the hole, so that the position of the socket 40 is determined. In this way, it is possible to prevent the socket 40 from being displaced.

The board 50 is disposed so as to be opposed to the other end surface 42 of the socket 40. The board 50 includes a connector 51, a board substrate 55, and a terminal. The board substrate 55 is, for example, a plate-like substrate, and has an upper surface and a lower surface. The lower surface of the board substrate 55 faces the socket 40. The terminal is disposed on the lower surface of the board substrate 55. The connector 51, which serves as an external input/output, is formed on the upper surface of the board substrate 55. The connector 51 of the board 50 is connected to the terminal of the board 50. The other ends of the movable pins 47 are in electrical contact with the terminal of the board 50.

The board 50, on which the connector 51 serving as the external input/output is formed, receives/outputs electric power, signals, and the like from/to the quantum chip 10 through the socket 40 and the interposer 20.

Next, advantageous effects of this example embodiment will be described. The quantum device 1 according to this example embodiment includes the socket 40 disposed so as to be opposed to the interposer 20. The socket 40 includes the movable pins 47 movable relative to the housing 45, and is in electrical contact with the terminal 24a of the interposer 20. Therefore, since the movable pins 47 are movable in accordance with the changes in volumes (hereinafter also referred to as the volume changes) of the terminal and the like which occur when the quantum device 1 is cooled to an extremely low temperature, it is possible to prevent the terminal(s) connected to the interposer 20 from being disconnected (e.g., from being broken). As described previously, the one ends and the other ends of the movable pins 47 are connected to their corresponding components in a conductive state with elastic means, such as a coil spring and a leaf spring, interposed therebetween. Therefore, the one ends and the other ends of the movable pins 47 are disposed in a pressed state between the interposer 20 and the board 50. Accordingly, the movable pins 47 are in a state in which each of them is pressed by the interposer 20 and the board 50 through the elastic means. Owing to this pressed state, the movable pins 47 can move in response to the volume changes resulting from contraction caused by cooling. As a result, the movable pins 47 can remain in contact with the terminal(s) and the like and thereby effectively prevent the terminal(s) and the like from being disconnected (e.g., from being broken).

Further, the socket 40 keeps the other ends of the movable pins 47 in electrical contact with the terminal of the board 50 on which the connector 51 serving as the external input/output is formed. Therefore, it is possible to secure the terminal(s) for external connection.

It is possible to easily determine the position of the socket 40 by providing the positioning pin 48. Further, it is possible to prevent the socket 40 from being displaced by inserting the positioning pin 48 into the hole formed in the opposite surface 22.

Second Example Embodiment

Figure 3:
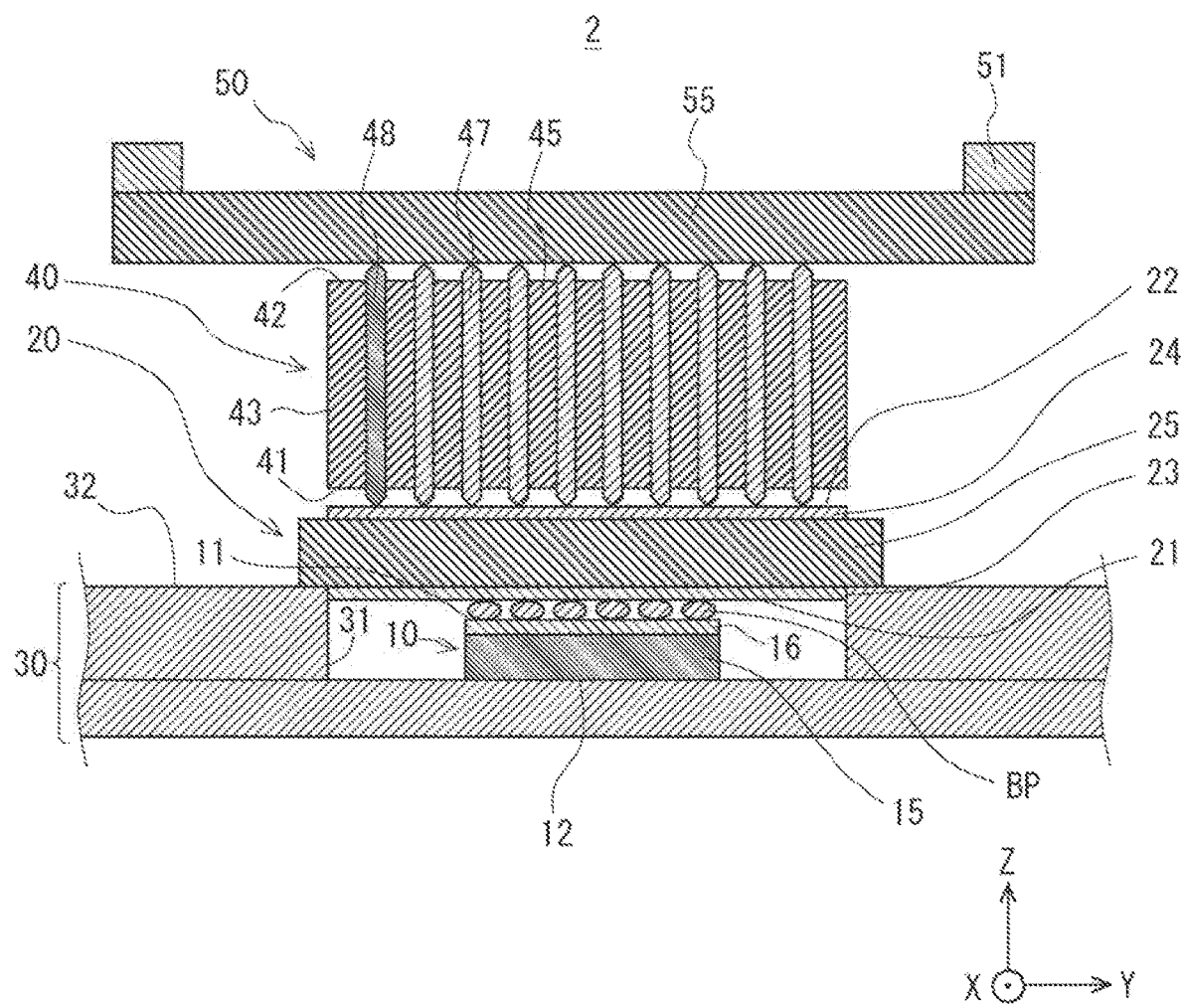
FIG. 3 is a cross-sectional view showing an example of a quantum device according to a second example embodiment.

Next, a quantum device according to a second example embodiment will be described. The quantum device according to this example embodiment is in contact with a sample stage having a cooling function. FIG. 3 is a cross-sectional view showing an example of a quantum device according to the second example embodiment. As shown in FIG. 3, in the quantum device 2, a part of at least one of the quantum chip 10, the interposer 20, and the socket 40 is in contact with a sample stage 30 having a cooling function. For example, in this example embodiment, at least a part of the interposer 20 is in contact with the sample stage 30. Specifically, a part of the mounting surface 21 of the interposer 20 is in contact with the sample stage 30.

The sample stage 30 has a cooling function. For example, the sample stage 30 is a cold stage that can be cooled to an extremely low temperature of about 10 [mK] by a refrigerator. The sample stage 30 preferably contains a metal such as Cu, a Cu alloy, or Al. In the case where the sample stage 30 contains Al, it may be insulated by carrying out an alumite treatment. In the quantum device 1 according to this example embodiment, for example, a superconducting phenomenon at an extremely low temperature of 9.2 [K] or lower is used when the quantum device 1 contains Nb as the superconducting material of the quantum chip 10, and a superconducting phenomenon at an extremely low temperature of 1.2 [K] or lower is used when the quantum device 1 contains Al as the superconducting material of the quantum chip 10. Therefore, the sample stage 30 that can be cooled to such an extremely low temperature is used.

A recessed part 31 is formed in the sample stage 30. For example, the recessed part 31 is formed in a predetermined surface 32 of the sample stage 30. The predetermined surface 32 is, for example, an upper surface that faces in the Z-axis positive direction. The recessed part 31 is open toward the Z-axis positive direction side. The recessed part 31 has, for example, a rectangular shape as viewed from above.

The quantum chip 10 is smaller than the recessed part 31 as viewed from above through the interposer 20 (i.e., as viewed while assuming that the interposer 20 is transparent). Meanwhile, the interposer 20 is larger than the recessed part 31 as viewed from above. The quantum chip 10 is disposed inside the recessed part 30 formed in the sample stage 31 having the cooling function. For example, the second surface 12 of the quantum chip 10 may be in contact with the inner surface of the recessed part 31 of the sample stage 30. Meanwhile, a part of the mounting surface 21 of the interposer 20, on which the quantum chip 10 is mounted, is in contact with the upper surface of the sample stage 30.

No interposer wiring layer 23 may be formed in the part of the mounting surface 21 of the interposer 20 that is in contact with the sample stage 30. Further, in the case where an insulating film is formed in the part of the mounting surface 21 that is in contact with the sample stage 30 in order to prevent electrical conduction with the sample stage 30, the interposer wiring layer 23 may be formed in that part of the mounting surface 21. In order to improve the thermal insulating property for reducing the change in the temperature (hereinafter also referred to as the temperature change) around the quantum chip, the area (e.g., space) surrounding the quantum chip 10 is preferably in a vacuum state or a reduced-pressure atmosphere state.

Next, advantageous effects of this example embodiment will be described. In the quantum device 2 according to this example embodiment, at least a part of the interposer 20 is in contact with the sample stage 30. In this way, it is possible to cool the quantum circuit 17 in the quantum chip 10 to an extremely low temperature by using the interposer 20 as a heat flow path, and thereby to use a superconducting phenomenon.

Further, the quantum chip 10 is disposed inside the sample stage 30 having the cooling function. Further, the second surface 12 of the quantum chip 10 is in contact with the inner surface of the recessed part 31 of the sample stage 30. Note that at least a part of the second surface 12 may be in contact with the inner surface of the recessed part 31. By the above-described configuration, it is possible to cool the quantum chip 10 from the second surface 12 side thereof by thermal conduction to the sample stage 30, and thereby to improve the cooling performance. Therefore, it is possible to enable the quantum circuit 17 in the quantum chip 10 to operate in a stabilized manner.

Further, since the second surface 12 is in contact with the inner surface of the recessed part 31, it is possible to reduce the stress and the strain caused by the difference between the thermal contraction of the quantum chip 10 caused by the change of the temperature to an extremely low temperature and that of the sample stage 30.

Since the opposite surface 22 of the interposer 20 is not in contact with the sample stage 30, it is possible to make full use of the opposite surface 22 of the interposer 20 for the terminal(s) 24a through which information is acquired from the quantum chip 10. Therefore, it is possible to increase the number of terminals through which information is acquired.

FIRST MODIFIED EXAMPLE

Figure 4:
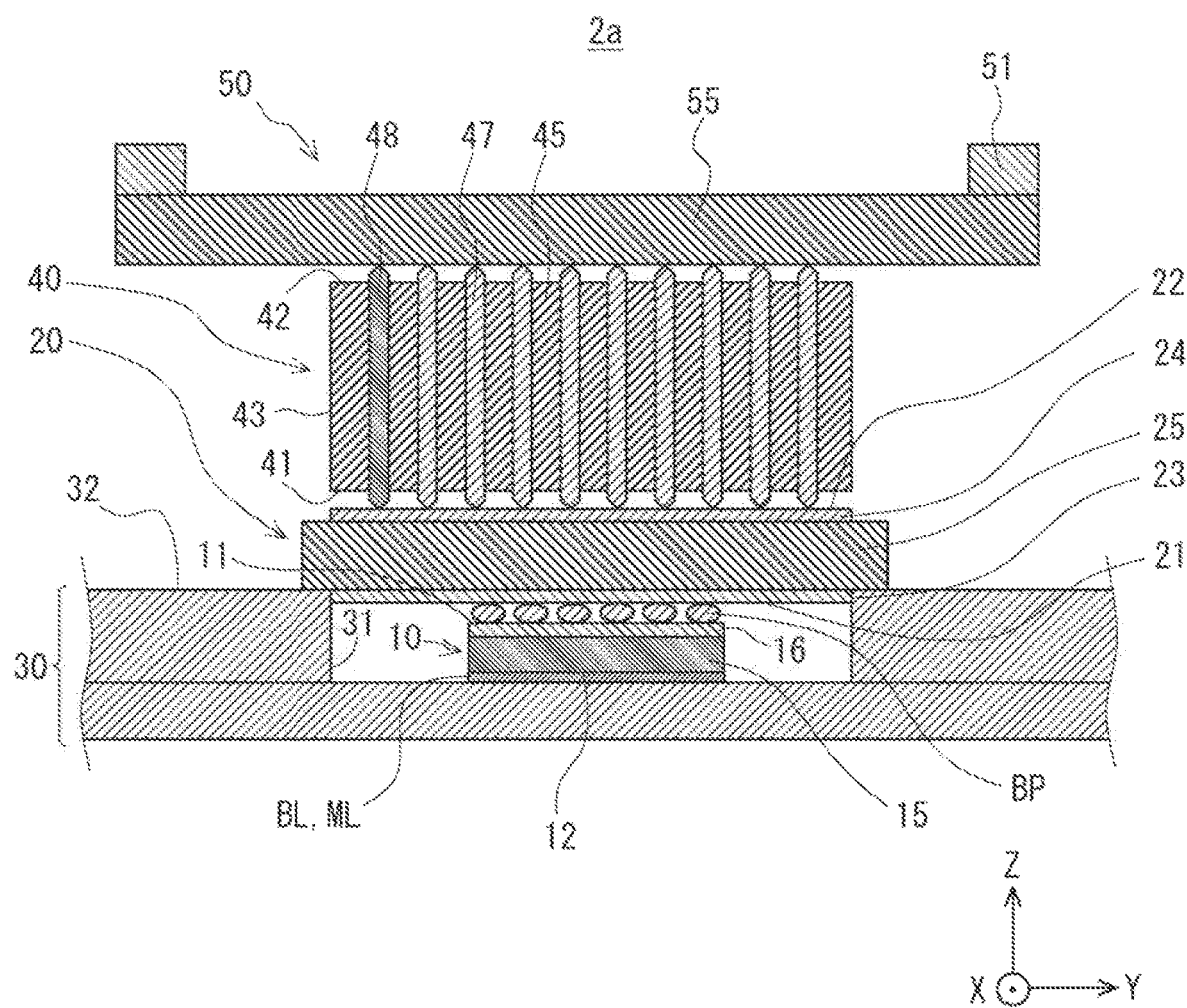
FIG. 4 is a cross-sectional view showing an example of a bonding layer or a junction layer according to a first modified example of the second example embodiment.

Next, a first modified example of the second example embodiment will be described. This modified example includes a bonding layer or a junction layer between the quantum chip 10 and the inner surface of the recessed part 31. FIG. 4 is a cross-sectional view showing an example of a bonding layer or a junction layer according to the first modified example of the second example embodiment. As shown in FIG. 4, in a quantum device 2a according to the first modified example, at least a part of the second surface 12 of the quantum chip 10 may be bonded or joined to the inner surface of the recessed part 31. For example, the second surface 12 may be bonded to the sample stage 30 by a bonding layer BL made of varnish, grease, or the like. Further, the second surface 12 may be joined by the sample stage 30 by using a junction layer ML, which is, for example, a metal layer, formed between the chip substrate 15 and the sample stage 30. By the above-described configuration, it is possible to improve the stability of the mounted quantum chip 10, and thereby to improve the accuracy of the position thereof. Further, the thermal connection with the sample stage 30 can be improved.

The bonding layer BL or the junction layer ML may be disposed over the entire surface of the second surface 12, or may be disposed on at least a part of the second surface 12, such as the periphery of the second surface 12 or the center of the second surface 12. For example, the bonding layer BL or the junction layer ML may be formed so as to avoid the area where the quantum circuit 17 is formed as viewed from above. In the case where the bonding layer BL is made of an insulating material, there is a risk that the bonding layer BL may act as a capacitor and resonate with the quantum circuit 17, causing a loss in the overall energy. It is possible to prevent or reduce the resonance by disposing the bonding layer BL so as to avoid the area where the quantum circuit 17 is formed.

Further, when the junction layer ML is electrically conductive such as when the junction layer ML is a metal layer, the ground potential of the quantum chip 10 may be obtained from the sample stage 30 through the junction layer ML, that is, the potential specified in the sample stage 30 may be obtained.

SECOND MODIFIED EXAMPLE

Figure 5:
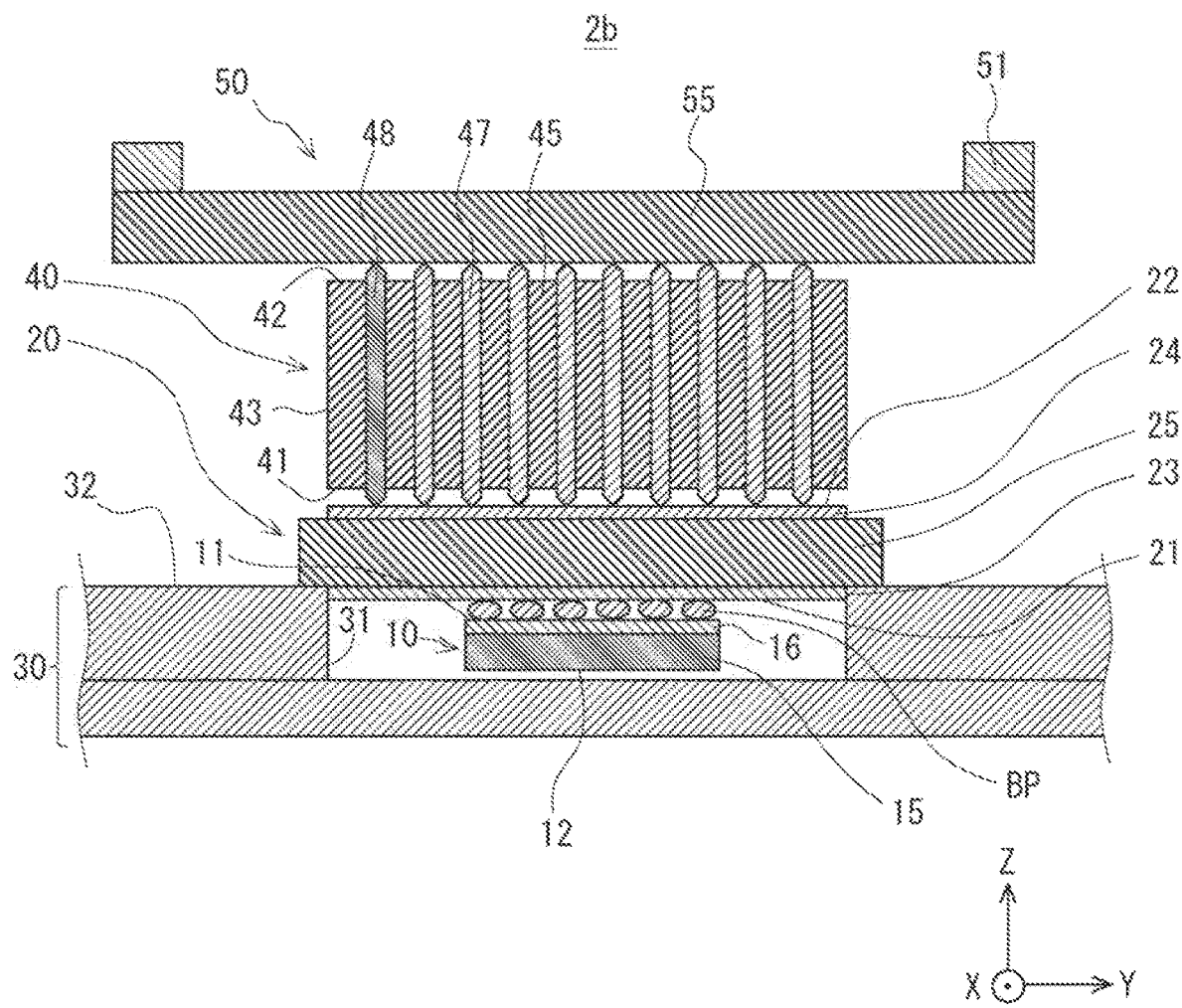
FIG. 5 is a cross-sectional view showing an example of a space between a quantum chip and an inner surface of a recessed part according to a second modified example of the second example embodiment.

Next, a second modified example of the second example embodiment will be described. In this modified example, there is a space between the quantum chip 10 and the inner surface of the recessed part 31. FIG. 5 is a cross-sectional view showing an example of a space between the quantum chip 10 and the inner surface of the recessed part 31 according to the second modified example of the second example embodiment. As shown in FIG. 5, in a quantum device 2b according to the second modified example, the quantum chip 10 does not have to be in contact with the sample stage 30. That is, the second surface 12 of the quantum chip 10 may be disposed in such a manner that a space is formed between the second surface 12 and the inner surface of the recessed part 31 of the sample stage 30. By the above-described configuration, it is possible to reduce the stress and the strain caused by the difference between the thermal contraction of the quantum chip 10 caused by the change of the temperature to an extremely low temperature and that of the sample stage 30.

THIRD MODIFIED EXAMPLE

Figure 6:
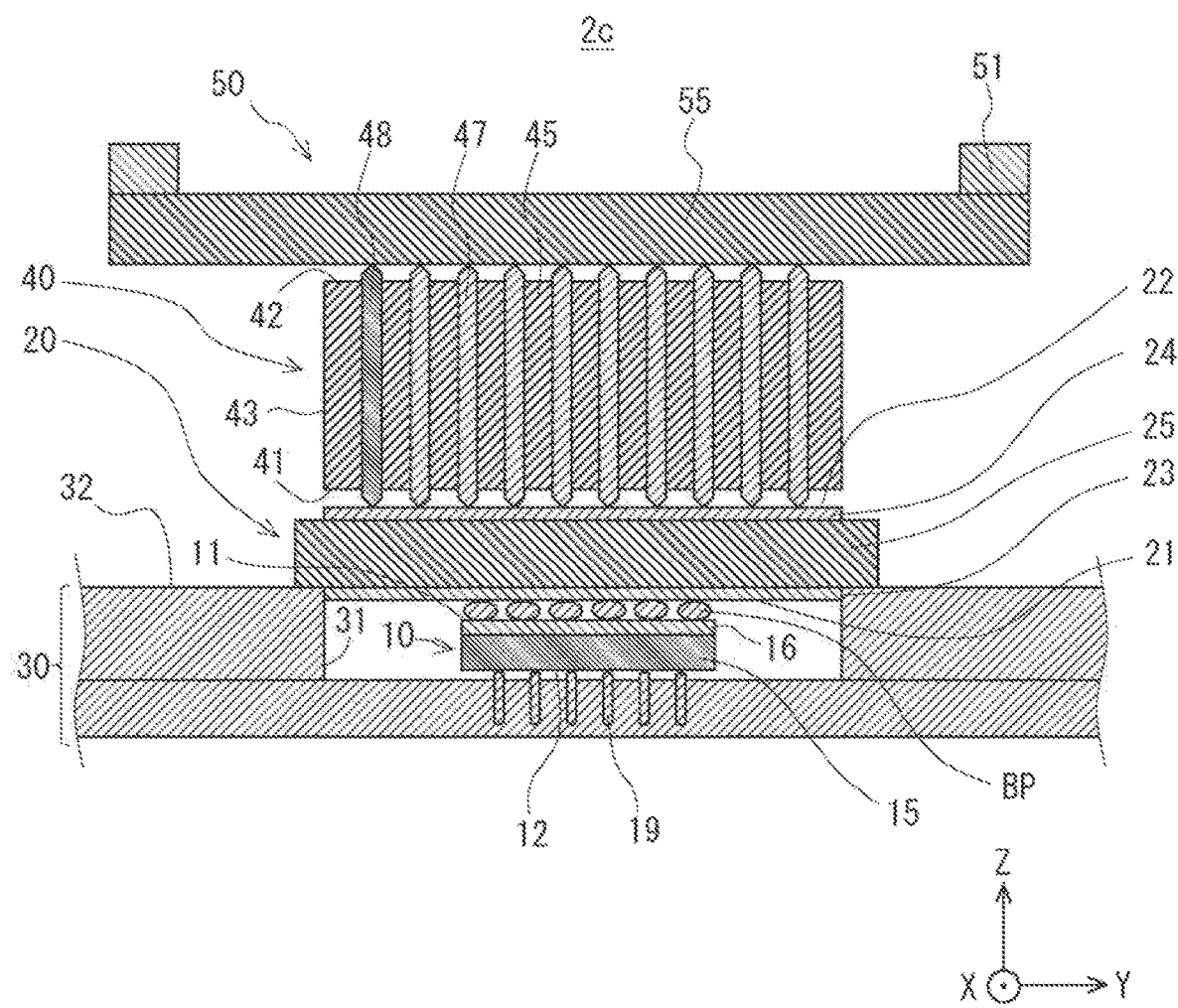
FIG. 6 is a cross-sectional view showing an example of chip pins protruding from a recessed part of a sample stage according to a third modified example of the second example embodiment.

Next, a third modified example of the second example embodiment will be described. This modified example includes chip pins that can be moved so as to protrude beyond the bottom of the recessed part 31 of the sample stage 30. FIG. 6 is a cross-sectional view showing an example of chip pins protruding beyond the recessed part 31 of the sample stage 30 according to the third modified example of the second example embodiment. As shown in FIG. 6, in a quantum device 2c according to the third modified example, the second surface 12 of the quantum chip 10 is in contact with chip pins 19 that can be moved so as to protrude beyond the bottom of the recessed part 31 of the sample stage 30.

For example, one or a plurality of chip pins 19 are provided at the bottom of the recessed part 31. The chip pins 19 extend in a direction perpendicular to the second surface 12. The chip pins 19 are disposed in holes formed at the bottom of the recessed part 31. One end of each chip pin 19 is in contact with the second surface 12 of the quantum chip 10.

The chip pins 19 preferably contain a material having high thermal conductivity. The chip pins 19 may contain the same material as that contained in the sample stage 30 and/or may contain the above-described superconducting material. The chip pins 19 may contain the same superconducting material as that contained in the wiring layer 16 and the like, and/or a superconducting material different from that contained in the wiring layer 16 and the like. Further, the chip pins 19 may contain the above-described normal conductive material. The chip pins 19 may contain the same normal conductive material as that contained in the interposer wiring layer 24 and the like, and/or a normal conductive material different from that contained in the interposer wiring layer 24 and the like. Further, the chip pins 19 may contain ceramic having high thermal conductivity such as aluminum nitride.

A constant potential may be applied to the chip pins 19. For example, a ground potential may be applied to the chip pins 19. In this way, the quantum chip 10 can obtain the ground potential from the chip pins 19. Note that, in such a case, the chip pins 19 preferably contain an electrically conductive material having high thermal conductivity.

The chip pins 19 are disposed in the holes by using an elastic body such as a spring. By the above-described configuration, since the chip pins 19 are in contact with the second surface 12 of the quantum chip 10, the cooling performance can be improved. Further, it is possible to reduce the stress and the strain caused by the difference between the thermal contraction of the quantum chip 10 caused by the change of the temperature to an extremely low temperature and that of the sample stage 30.

FOURTH MODIFIED EXAMPLE

Figure 7:
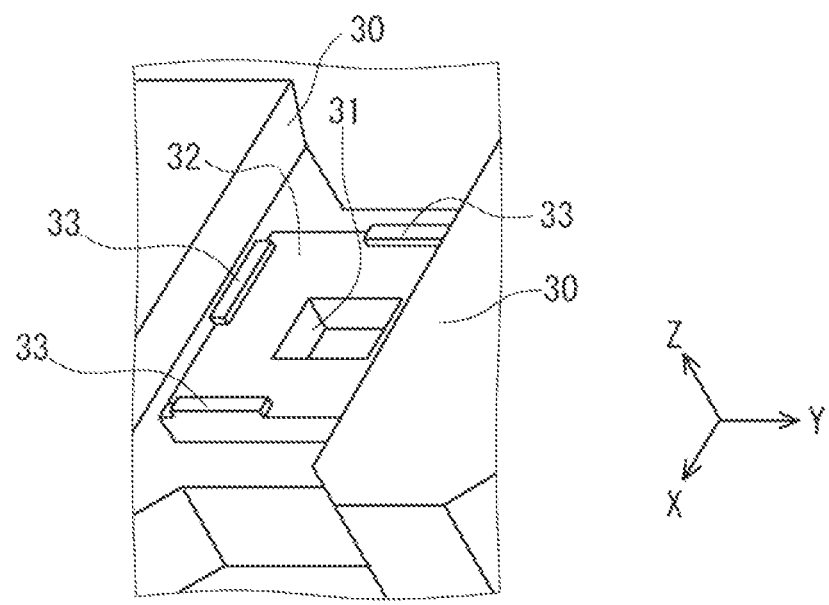
FIG. 7 is a perspective view showing an example of a recessed part and a pressing member of a sample stage according to a fourth modified example of the second example embodiment.
Figure 8:
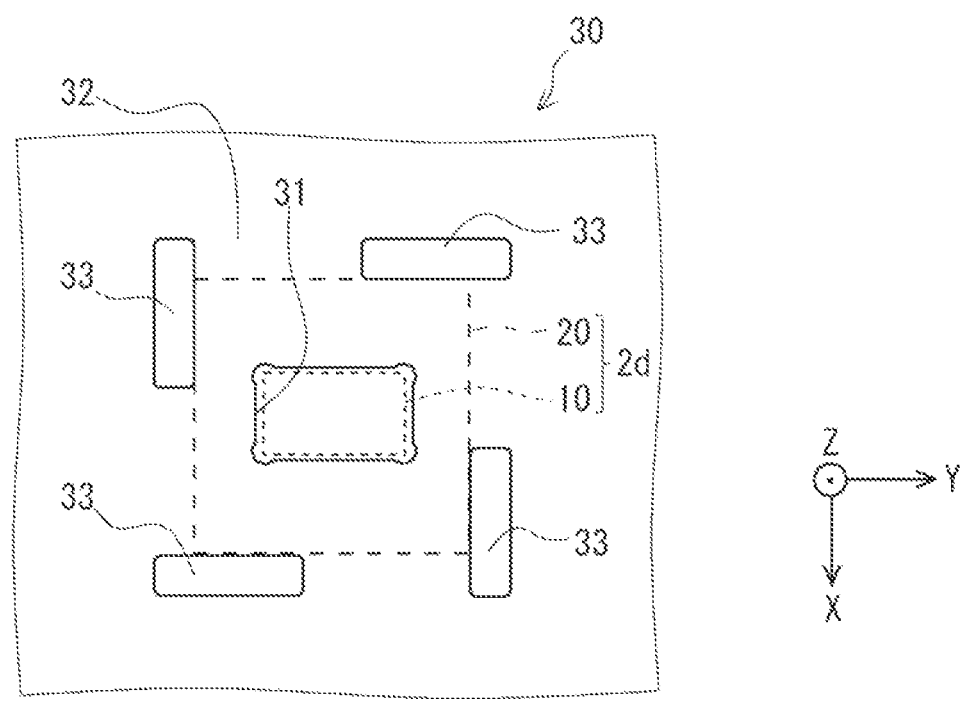
FIG. 8 is a plan view showing the example of the recessed part and the pressing member of the sample stage according to the fourth modified example of the second example embodiment.

Next, a fourth modified example of the second example embodiment will be described. This modified example includes pressing members on a predetermined surface 32 of the sample stage 30. FIG. 7 is a perspective view showing an example of a recessed part 31 and pressing members of the sample stage 30 according to the fourth modified example of the second example embodiment. FIG. 8 is a plan view showing the example of the recessed part 31 and the pressing members of the sample stage 30 according to the fourth modified example of the second example embodiment. As shown in FIGS. 7 and 8, in a quantum device 2d according to the fourth modified example, the recessed part 31 is formed in the predetermined surface 32 of the sample stage 30, which is, for example, the upper surface of the sample stage 30. Further, a plurality of pressing members 33 are provided around the recessed part 31 on the predetermined surface 32. For example, four pressing members 33 are provided on the predetermined surface 32.

At least a part of the side surface of the interposer 20 is in contact with the pressing members 33 disposed on the predetermined surface 32. For example, in the case where the interposer 20 has a rectangular shape as viewed from above, flat-surface parts of the plurality of pressing members 33 press parts of the side surface of the interposer 20 near the corners thereof. By the above-described configuration, the plurality of pressing members 33 can press, by the flat-surface parts thereof, diagonal parts of the side surface of the interposer 20 in a discontinuous manner (i.e., a distributed manner). Therefore, this feature enables the quantum chip 10 to linearly slide when the interposer 20 or the pressing members 33 contract at a low temperature, making it possible to make the contraction uniform.

FIFTH MODIFIED EXAMPLE

Figure 9:
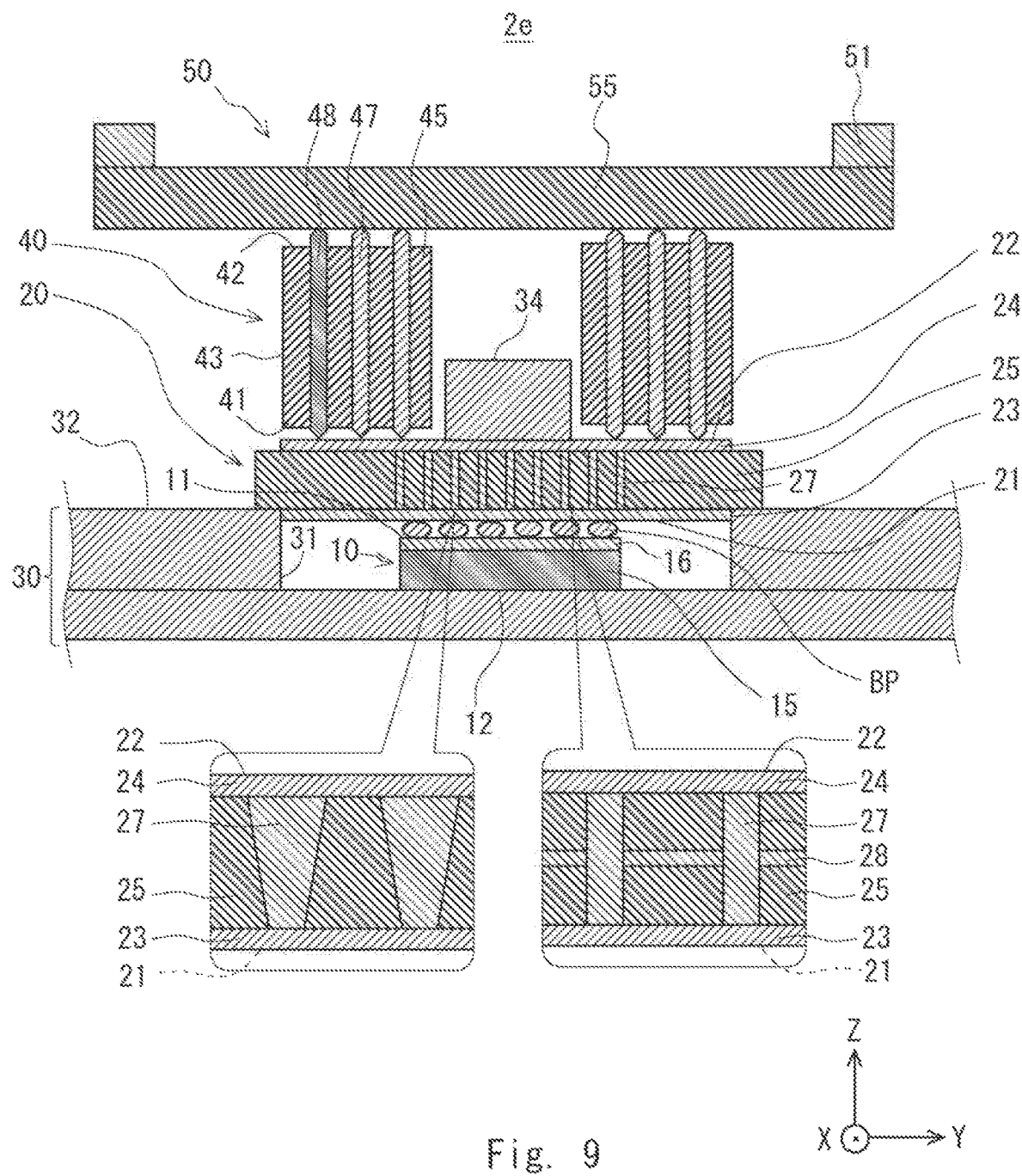
FIG. 9 is a cross-sectional view showing an example of a cooling member and thermal vias according to a fifth modified example of the second example embodiment.

Next, a fifth modified example of the second example embodiment will be described. This modified example includes a cooling member on the opposite surface 22 of the interposer 20, and includes thermal vias (i.e., thermal vias and a conductive material with which the thermal vias are filled) inside the interposer 20. FIG. 9 is a cross-sectional view showing an example of a cooling member and thermal vias according to the fifth modified example of the second example embodiment. In FIG. 9, illustration of the TVs 26 of the interposer 20 is omitted in order to prevent the drawing from becoming too complicated. As shown in FIG. 9, in a quantum device 2e according to the fifth modified example, the opposite surface 22 of the interposer 20 may be in contact with a cooling member 34. The cooling member 34 has a cooling function. For example, the cooling member 34 may have a cooling function that is obtained as the cooling member 34 comes into contact with the sample stage 30. By the above-described configuration, it is possible to cool the opposite surface 22 of the interposer 20 by thermal conduction to the cooling member 34, and thereby to improve the cooling performance.

When the cooling member 34 is disposed on the opposite surface 22 of the interposer 20, the socket 40 is disposed around the cooling member 34 so as to avoid the cooling member 34, such as being disposed in a square frame shape or in a U-shape, as viewed from above.

Further, the interposer 20 may include thermal vias 27. The thermal vias 27 may be members that extend in a direction perpendicular to the mounting surface 21 of the interposer substrate 25. For example, the thermal vias 27 may extend through the interposer substrate 25. As described above, the interposer 20 may include thermal vias 27 extending from the mounting surface 21 side of the interposer substrate 25 to the opposite surface 22 side thereof. Each of the thermal vias 27 may has, for example, a columnar shape, such as a circular pillar shape or a square pillar shape, having a central axis extending in the direction perpendicular to the mounting surface 21. The thermal vias 27 can transfer heat between the mounting surface 21 side and the opposite surface 22 side.

The thermal vias 27 preferably contain a material having high thermal conductivity. The thermal vias 27 may contain the above-described superconducting material. The thermal vias 27 may contain the same superconducting material as that contained in the wiring layer 16 and the like, and/or a superconducting material different from that contained in the wiring layer 16 and the like. Further, the thermal vias 27 may contain the above-described normal conductive material. The thermal vias 27 may contain the same normal conductive material as that contained in the interposer wiring layer 24 and the like, and/or a normal conductive material different from that contained in the interposer wiring layer 24 and the like. Further, the thermal vias 27 may contain ceramic having high thermal conductivity such as aluminum nitride.

The thermal vias 27 may be connected to the cooling member 34. By the above-described configuration, the cooling performance of the quantum device 1d can be improved. Note that the quantum device 1d may be provided only with the cooling member 34 without being provided with the thermal vias 27, or may be provided only with the thermal vias 27 without being provided with the cooling member 34. Further, the quantum device 1d may be provided with both the cooling member 34 and the thermal vias 27.

Further, as shown in a balloon in the figure, the thermal vias 27 may include a tapered part (or a tapered via) in which the diameter on the opposite surface 21 side is larger than that on the mounting surface 22 side. That is, the thermal vias 27 may include a part (or a thermal via) having a roughly truncated cone shape of which the diameter of its cross section increases toward the opposite surface 22 side. It is possible to increase the heat capacity by adopting the tapered shape and thereby to ease the abrupt temperature change. Therefore, it is possible to improve the stability of the thermal vias 27 against the temperature change. Further, in the case where the thermal vias 27 are in contact with the cooling member 34, the thermal junction area with the cooling member 34 increases. Therefore, it is possible to promote the heat transfer more effectively. It should be noted that when the temperature at the interface between the thermal via 27 and the through hole (i.e., the interface between the material with which the thermal via is filled and the inner wall surface of the thermal via) is changed from a room temperature to an extremely low temperature, in some cases, the adhesion force at the interface deteriorates. For example, if a force larger than the adhesive force is applied at the interface between the thermal via 27 and the through hole due to the thermal contraction or if a material having a low elastic modulus is used for the wall surface of the thermal via 27, the elastic modulus increases (molecules become motionless) at an extremely low temperature or lower, raising a possibility that exfoliation occurs due to the loss of the adhesive force. It is considered that when the exfoliation occurs, the position of the thermal via 27 (i.e., the material with which the thermal via is filled) may be shifted. However, since the thermal via 27 has the tapered shape, the contact surface at the interface between the thermal via 27 (i.e., the material with which the thermal via is filled) and the through hole can be maintained even though its vertical position may be shifted. A part having a protruding shape by which the contact between the thermal via 27 and the cooling member 34 is maintained even when the thermal via 27 is moved may be formed in the cooling member 34 in advance, so that the contact between the cooling member 34 and the thermal vias 27 is maintained.

Further, as shown in the other balloon in the figure, the interposer 20 may include a common connection member 28 that connects a plurality of thermal vias 27 to each other. For example, a plurality of thermal vias 27 may be connected to each other by a plate-like connection member 28 disposed parallel to the mounting surface 21. The connection member 28 preferably contains a material having high thermal conductivity, and may contain a material similar to that contained in the thermal vias 27. The plurality of thermal vias 27 connected by the connection member 28 can increase the heat capacity and thereby reduce the temperature change.

Further, a constant potential may be applied to the plurality of thermal vias 27 which are connected to each other by the connection member 28. For example, a ground potential may be applied to the plurality of thermal vias 27. In this way, the quantum chip 10 or the interposer 20 can obtain the ground potential from the thermal vias 27. Note that, in such a case, the thermal vias 27 and the connection member 28 preferably contain an electrically conductive material having high thermal conductivity.

In the interposer 20, an area in which wiring lines or signal lines connected to the quantum circuit 17 are disposed (e.g., formed) generates a larger amount of heat than the other areas do. Therefore, the density of thermal vias 27 in such an area is preferably made higher than the density thereof in the other areas. For example, when the quantum chip 10 is mounted at the center of the interposer 20 as viewed from above the interposer substrate 25, the density of thermal vias 27 in the central area is made higher than the density thereof in the peripheral area. Further, in the interposer 20, the density of thermal vias 27 near the TVs 26, which are used to transmit signals from the quantum circuit 17, is preferably made higher than the density thereof in the other areas. In this way, the cooling performance can be improved.

SIXTH MODIFIED EXAMPLE

Figure 10:
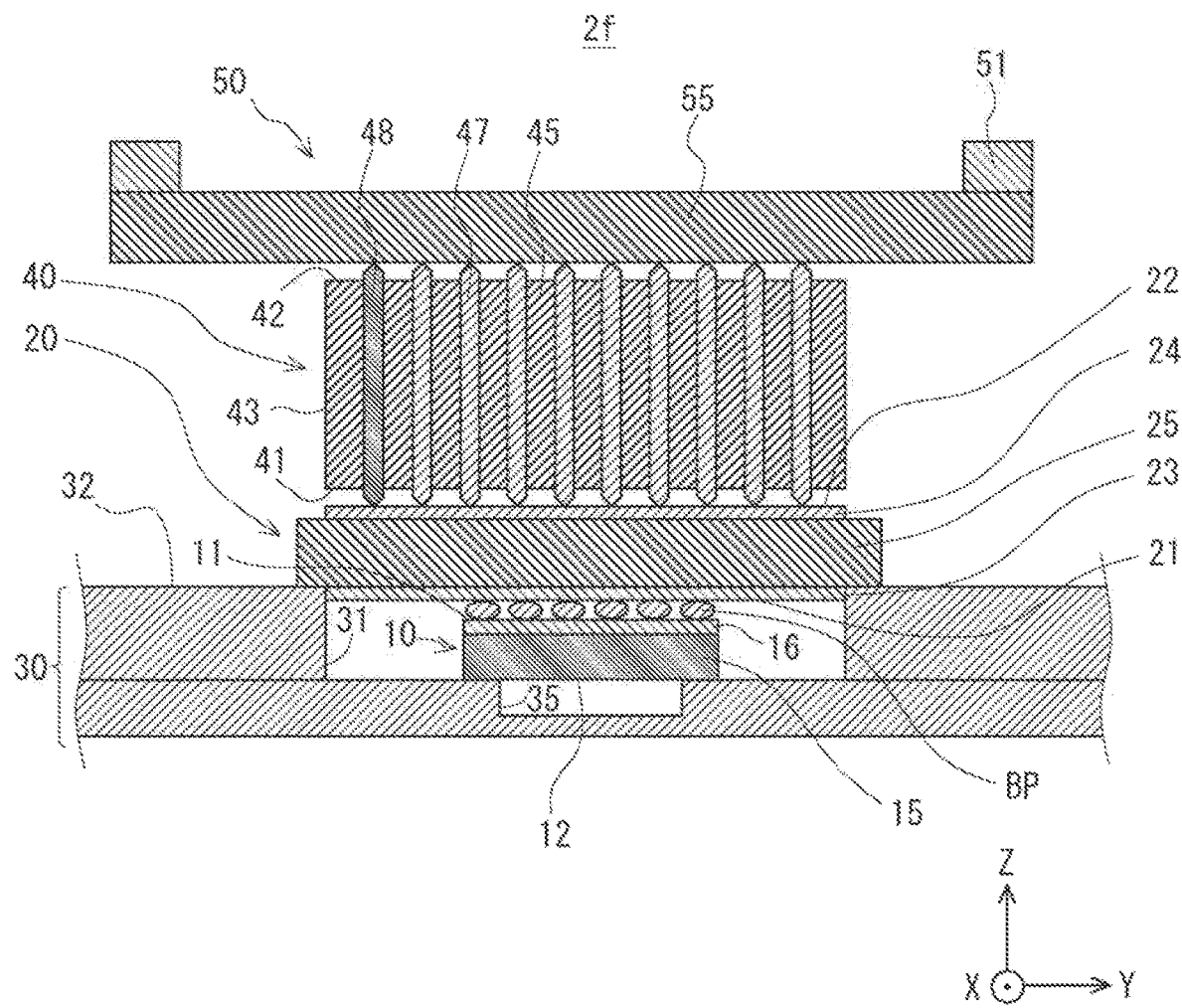
FIG. 10 is a cross-sectional view showing an example of a recessed part formed at the bottom of a recessed part of a sample stage according to a sixth modified example of the second example embodiment.
Figure 11:
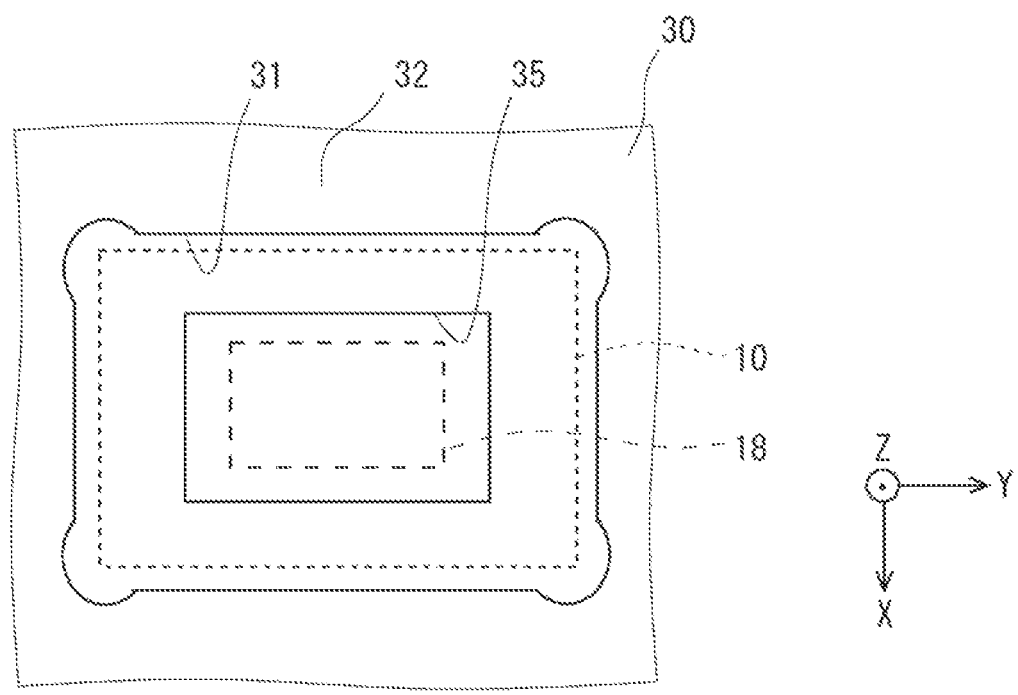
FIG. 11 is a plan view showing the example of the recessed part formed at the bottom of the recessed part of the sample stage according to the sixth modified example of the second example embodiment.

Next, a sixth modified example according to the second example embodiment will be described. In this modified example, a recess is provided (e.g., formed) at the bottom of the recessed part 31 of the sample stage 30. FIG. 10 is a cross-sectional view showing an example of a recess formed at the bottom of the recessed part 31 of the sample stage 30 according to the sixth modified example of the second example embodiment. FIG. 11 is a plan view showing the example of the recess formed at the bottom of the recessed part 31 of the sample stage 30 according to the sixth modified example of the second example embodiment. As shown in FIGS. 10 and 11, in a quantum device 2f according to the sixth modified example, a recess 35 is formed at the bottom of the recessed part 31. As shown in FIG. 11, the area of the recess 35 is larger than an area 18 in which the quantum circuit 17 is formed as viewed from above. Therefore, the area 18 where the quantum circuit 17 is formed is included in the area of the recess 35. The periphery of the second surface 12 of the quantum chip 10 may be in contact with the bottom of the recessed part 31. The central part of the second surface 12 of the quantum chip 10 covers the recess 35.

The area of recess 35 may be larger than the quantum chip 10 as viewed from above. In such a case, the second surface 12 of the quantum chip 10 is not in contact with the bottom of the recessed part 31.

In the quantum device 2f, as viewed from above, since the area of the recess 35 is larger than the area 18 in which the quantum circuit 17 is formed, it is possible to increase the distance between the area 18 in which the quantum circuit 17 is formed and the sample stage 30 containing a metal or the like. In this way, it is possible to prevent a pseudo capacitor from being formed and thereby to reduce the influence of the resonance that occurs in the main material, such as silicon, of the chip substrate 15. Therefore, it is possible to reduce the influence on the operating frequency of the quantum circuit 17.

SEVENTH MODIFIED EXAMPLE

Figure 12:
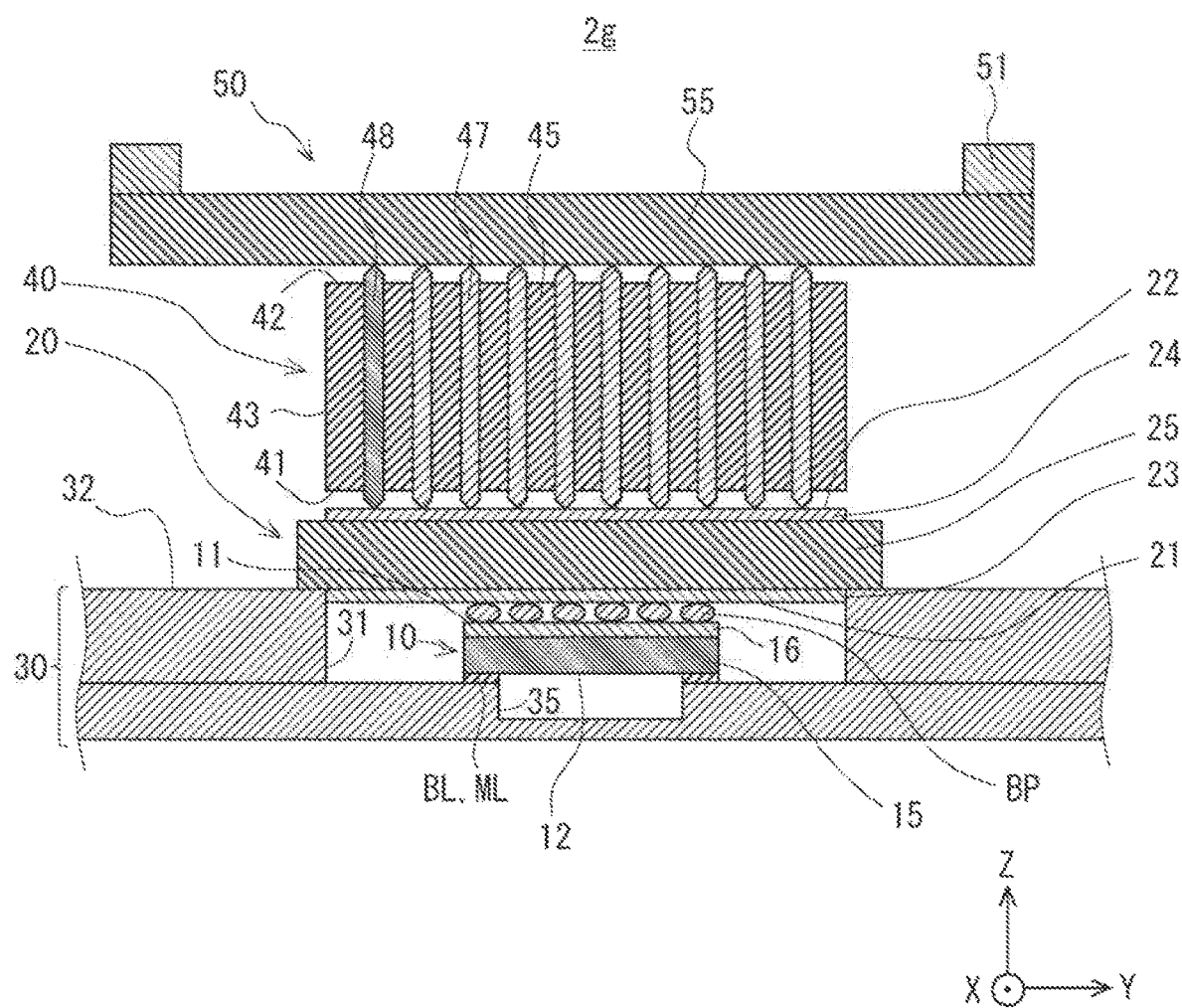
FIG. 12 is a cross-sectional view showing an example of a recessed part formed at the bottom of a recessed part of a sample stage according to a seventh modified example of the second example embodiment.

Next, a seventh modified example of the second example embodiment will be described. In this modified example, the periphery of the second surface 12 of the quantum chip 10 is bonded or joined to the periphery of the recess 35. FIG. 12 is a cross-sectional view showing an example of a recess 35 formed at the bottom of the recessed part 31 of the sample stage 30 according to the seventh modified example of the second example embodiment. As shown in FIG. 12, in a quantum device 2g according to the seventh modified example, the periphery of the second surface 12 of the quantum chip 10 may be bonded to the bottom of the recessed part 31 by a bonding layer BL, or may be joined thereto by a junction layer ML, which is, for example, a metal layer. By the above-described configuration, it is possible to improve the stability of the mounted quantum chip 10 while recuing the influence of the resonance, and thereby to improve the accuracy of the position thereof. Further, the thermal connection with the sample stage 30 can be improved.

EIGHTH MODIFIED EXAMPLE

Figure 13:
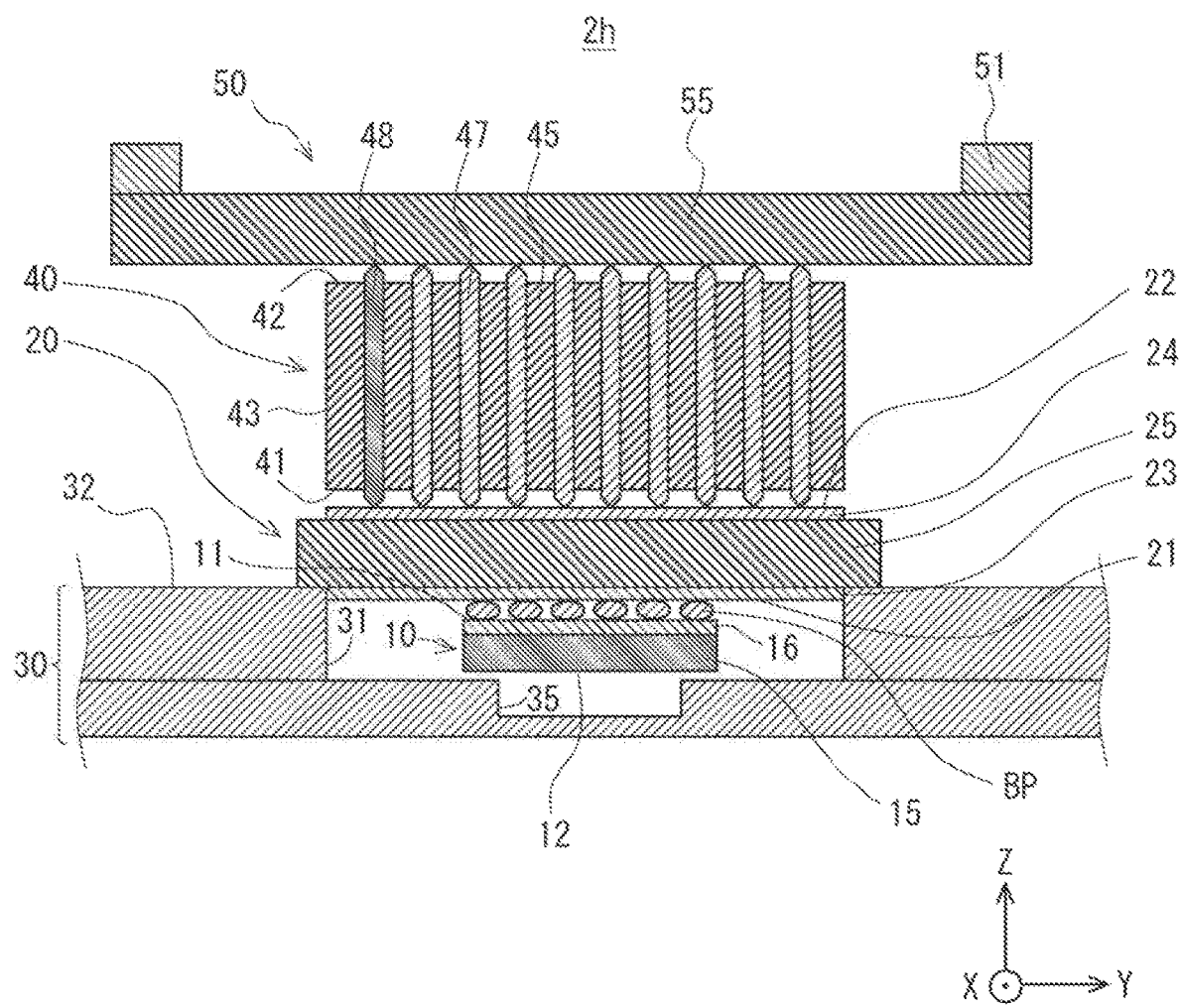
FIG. 13 is a cross-sectional view showing an example of a recessed part formed at the bottom of a recessed part of a sample stage according to an eighth modified example of the second example embodiment.

Next, an eighth modified example according to the second example embodiment will be described. This modified example includes a space between the periphery of the second surface 12 of the quantum chip 10 and the periphery of the recess 35. FIG. 13 is a cross-sectional view showing an example of a recess 35 formed at the bottom of the recessed part 31 of the sample stage 30 according to the eighth modified example of the second example embodiment. As shown in FIG. 13, in a quantum device 2h according to the eighth modified example, the periphery of the second surface 12 of the quantum chip 10 does not have to be in contact with the sample stage 30. That is, the periphery of the second surface 12 of the quantum chip 10 may be disposed in such a manner that a space is formed between the periphery of the second surface 12 and the bottom of the recessed part 31. By the above-described configuration, it is possible to reduce the stress and the strain caused by the difference between the thermal contraction of the quantum chip 10 caused by the change of the temperature to an extremely low temperature and that of the sample stage 30 while reducing the influence of the resonance.

NINTH MODIFIED EXAMPLE

Figure 14:
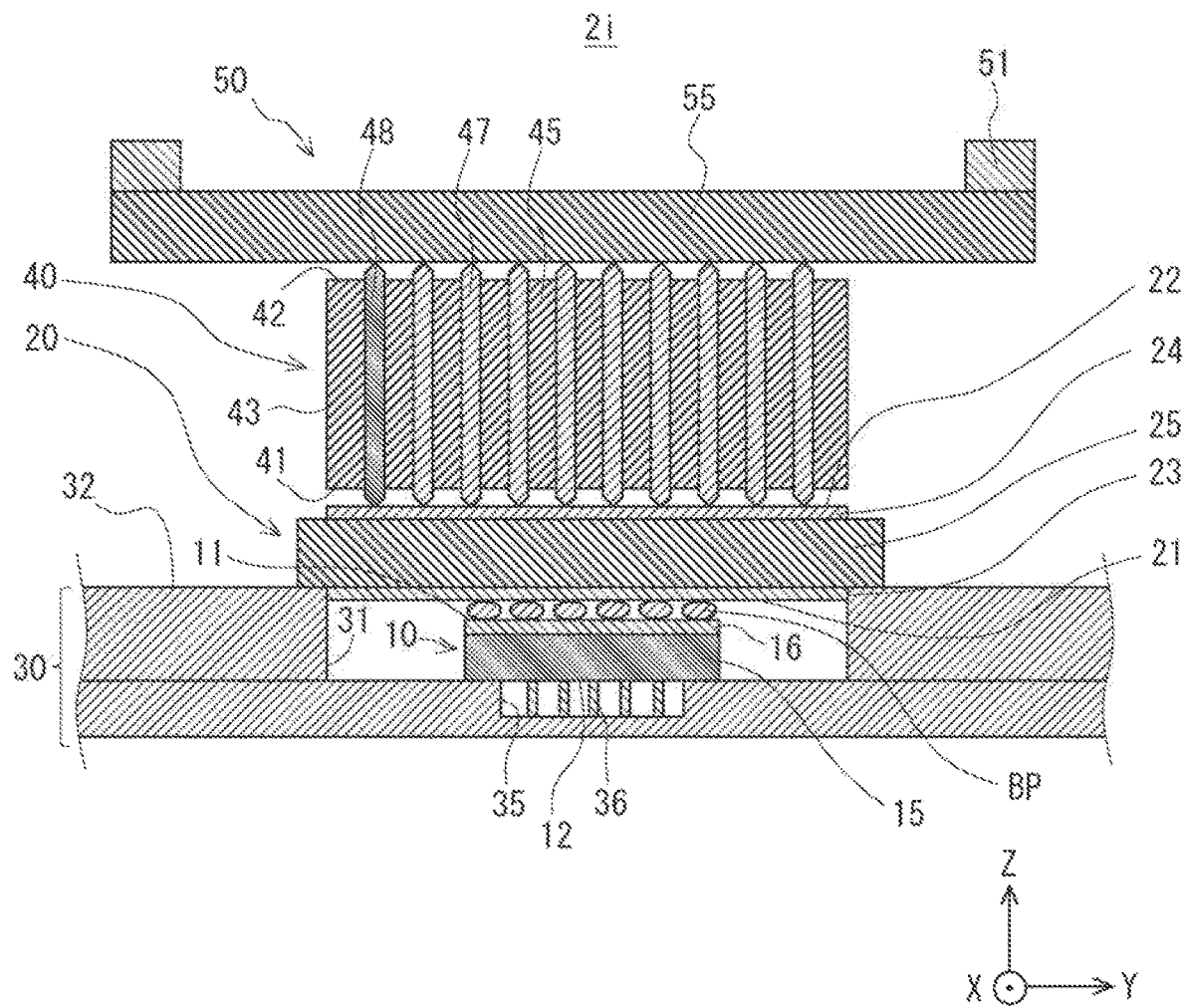
FIG. 14 is a cross-sectional view showing an example of a recess formed at the bottom of a recessed part of a sample stage and pillars formed in the recess according to a ninth modified example of the second example embodiment.

Next, a ninth modified example according to the second example embodiment will be described. This modified example includes pillars in the recess 35. FIG. 14 is a cross-sectional view showing an example of the recess 35 formed at the bottom of the recessed part 31 of the sample stage 30 and pillars according to the ninth modified example of the second example embodiment. As shown in FIG. 14, in a quantum device 2i according to the ninth modified example, the recess 35 is formed at the bottom of the recessed part 31. Further, one or a plurality of pillars 36 are provided in the recess 35. The pillars 36 extend in a direction perpendicular to the first and second surfaces 11 and 12. One end of each pillar 36 is connected to the bottom of the recess 35, and the other end of the pillar 36 is in contact with the second surface 12 of the quantum chip 10. As described above, the quantum chip 10 is in contact with the pillars 36 extending from the bottom of the recess 35 in the direction perpendicular to the first surface 11. The pillars 36 may be circular pillars or square pillars. The pillars 36 may contain a material similar to that contained in the chip pins 19. The one or plurality of pillars 36 and the second surface 12 may be bonded to each other by a bonding layer BL, or may be bonded by a metal layer.

In a quantum device 2i, as viewed from above, since the area of the recess 35 is larger than the area 18 in which the quantum circuit 17 is formed, it is possible to increase the distance between the area 18 in which the quantum circuit 17 is formed and the sample stage 30 containing a metal or the like. In this way, it is possible to reduce the influence of the resonance that occurs in the main material, such as silicon, of the chip substrate 15. In addition, since the pillars 36 are in contact with the second surface 12 of the quantum chip 10, the cooling performance can be improved.

Note that the pillars 36 may be configured so as to be movable beyond the bottom of the recess 35. That is, the pillars 36 may be used as a substitute for the chip pins 19.

TENTH MODIFIED EXAMPLE

Figure 15:
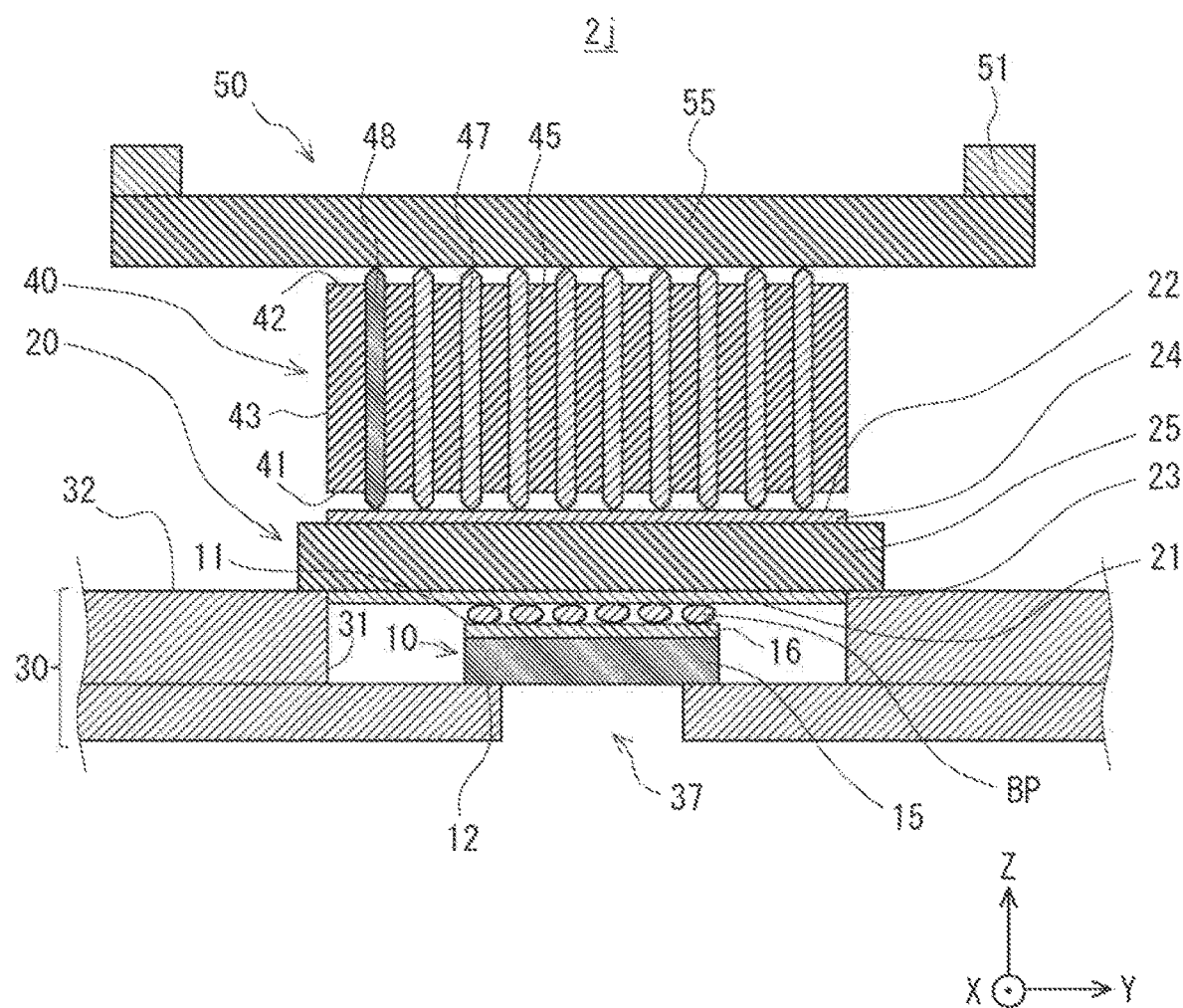
FIG. 15 is a cross-sectional view showing an example of through holes formed at the bottom of a recessed part of a sample stage according to a tenth modified example of the second example embodiment.

Next, a tenth modified example of the second example embodiment will be described. In this modified example, the sample stage 30 includes a through hole at the bottom of the recessed part 31. FIG. 15 is a cross-sectional view showing an example of a through hole formed at the bottom of the recessed part 31 of the sample stage 30 according to the tenth modified example of the second example embodiment. As shown in FIG. 15, in a quantum device 2j according to the tenth modified example, a through hole 37 is formed at the bottom of the recessed part 31. The area of the through hole 37 is larger than the area 18 in which the quantum circuit 17 is formed as viewed from above. Therefore, the area 18 where the quantum circuit 17 is formed is included in the area of the through hole 37. The periphery of the second surface 12 of the quantum chip 10 may be in contact with the bottom of the recessed part 31, and/or may be bonded or joined to the bottom of the recessed part 31. The central part of the second surface 12 of the quantum chip 10 covers the through hole 37.

In the quantum device 2j, as viewed from above, since the area of the through hole 37 is larger than the area 18 in which the quantum circuit 17 is formed, it is possible to increase the distance between the area 18 in which the quantum circuit 17 is formed and the sample stage 30 containing a metal or the like. In this way, it is possible to reduce the influence of the resonance that occurs in the main material, such as silicon, of the chip substrate 15. Therefore, it is possible to reduce the influence on the operating frequency of the quantum circuit 17.

ELEVENTH MODIFIED EXAMPLE

Figure 16:
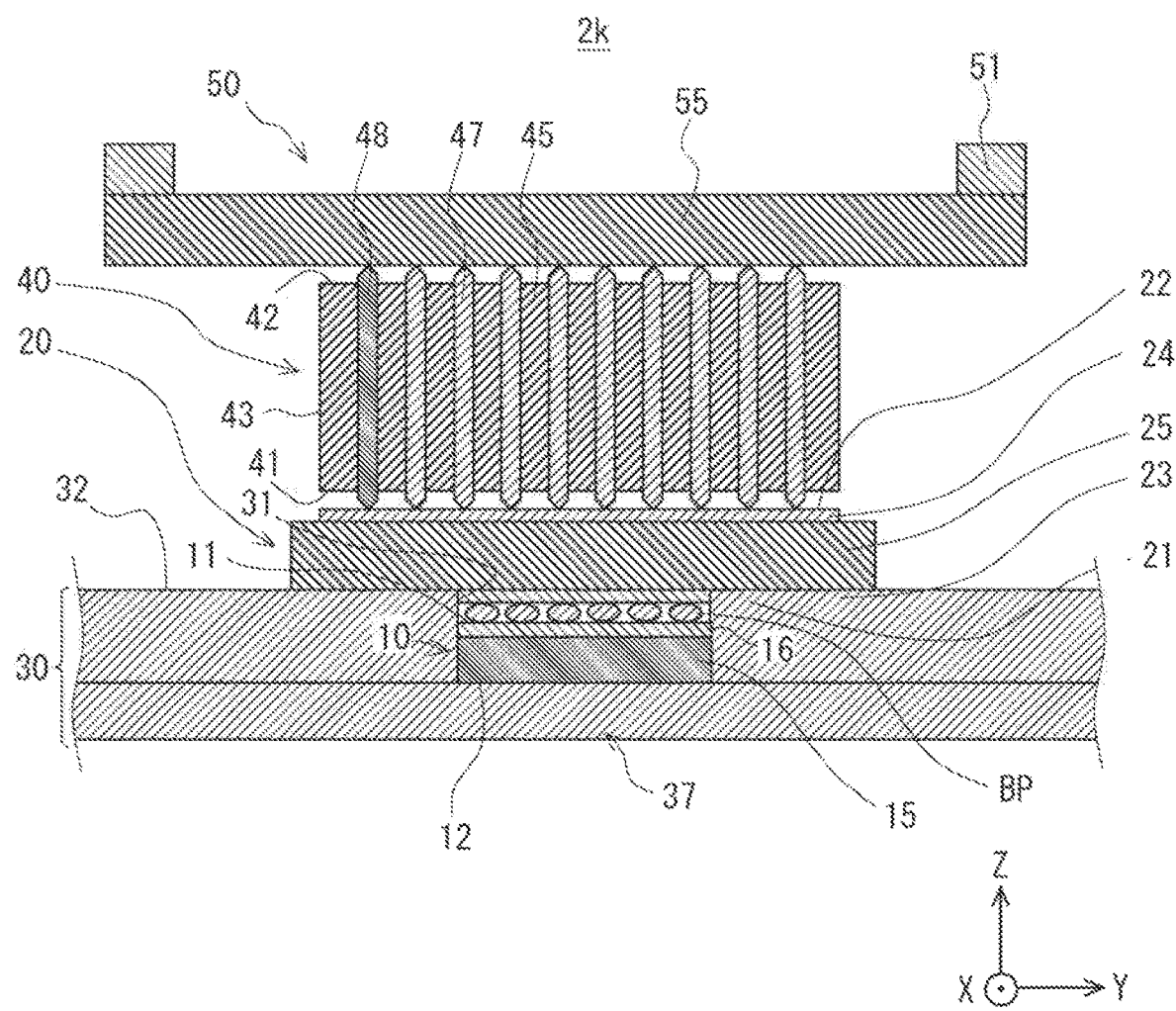
FIG. 16 is a cross-sectional view showing an example of a recessed parted part of a sample stage according to an eleventh modified example of the second example embodiment.

Next, an eleventh modified example of the second example embodiment will be described. In this modified example, the quantum chip 10 inserted into the recessed part 31 at an extremely low temperature. FIG. 16 is a cross-sectional view showing an example of the recessed part 31 of the sample stage 30 according to the eleventh modified example of the second example embodiment. As shown in FIG. 16, in a quantum device 2k according to the eleventh modified example, the quantum chip 10 is inserted into the recessed part 31 at an extremely low temperature. Therefore, the side surface of the quantum chip 10 is in contact with the inner surface of the recessed part 31. In this way, since the quantum chip 10 is cooled from its side surface by thermal conduction, the cooling performance can be improved.

It should be noted that when the quantum device 2k is cooled from a room temperature to an extremely low temperature such as a single-digit temperature [mK], the volumes of the quantum chip 10, the interposer 20, and the sample stage 30 change. Therefore, in order to take the aforementioned volume changes into consideration in advance, the quantum device 2k is configured so that the side surface of the quantum chip 10 comes into contact with the recessed part 31 at an extremely low temperature. Further, the ground potential of the quantum chip 10 may be obtained from the sample stage 30 through the side surface of the quantum chip 10.

TWELFTH MODIFIED EXAMPLE

Figure 17:
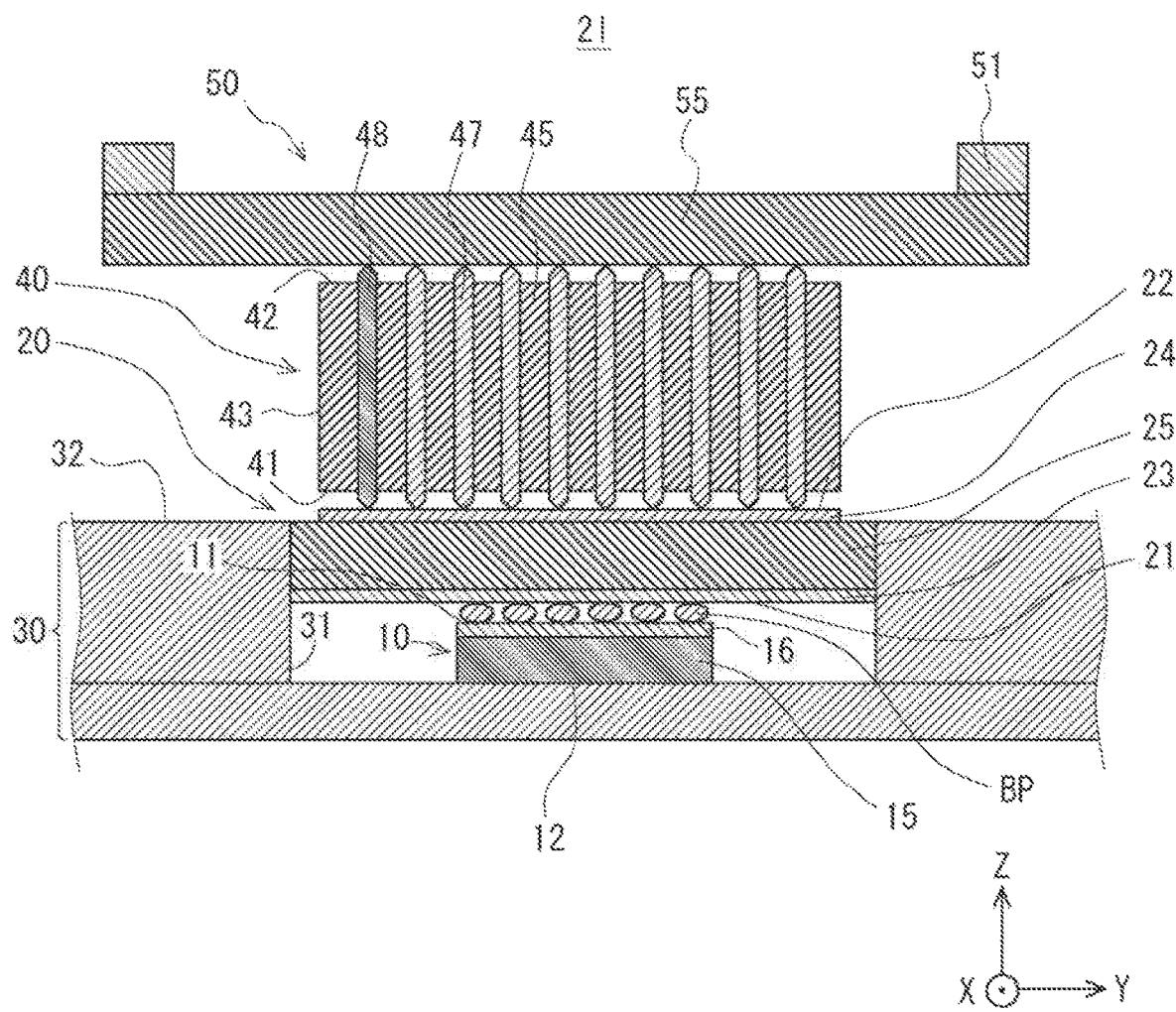
FIG. 17 is a cross-sectional view showing an example of a quantum device according to a twelfth modified example of the second example embodiment.

Next, a twelfth modified example according to the second example embodiment will be described. In this modified example, the side surface of the interposer 20 is in contact with the inner surface of the recessed part 31. FIG. 17 is a cross-sectional view showing an example of a quantum device according to the twelfth modified example of the second example embodiment. As shown in FIG. 17, in the quantum device 2l according to this modified example, at least a part of the side surface of the interposer 20 is in contact with the inner surface of the recessed part 31.

By the above-described configuration, since the mounting surface 21 of the interposer 20 does not have to be in contact with the sample stage 30, it is possible to make full use of the mounting surface 21. For example, the interposer wiring layer 23 can be formed on the mounting surface 21 to the maximum extent.

THIRTEENTH MODIFIED EXAMPLE

Figure 18:
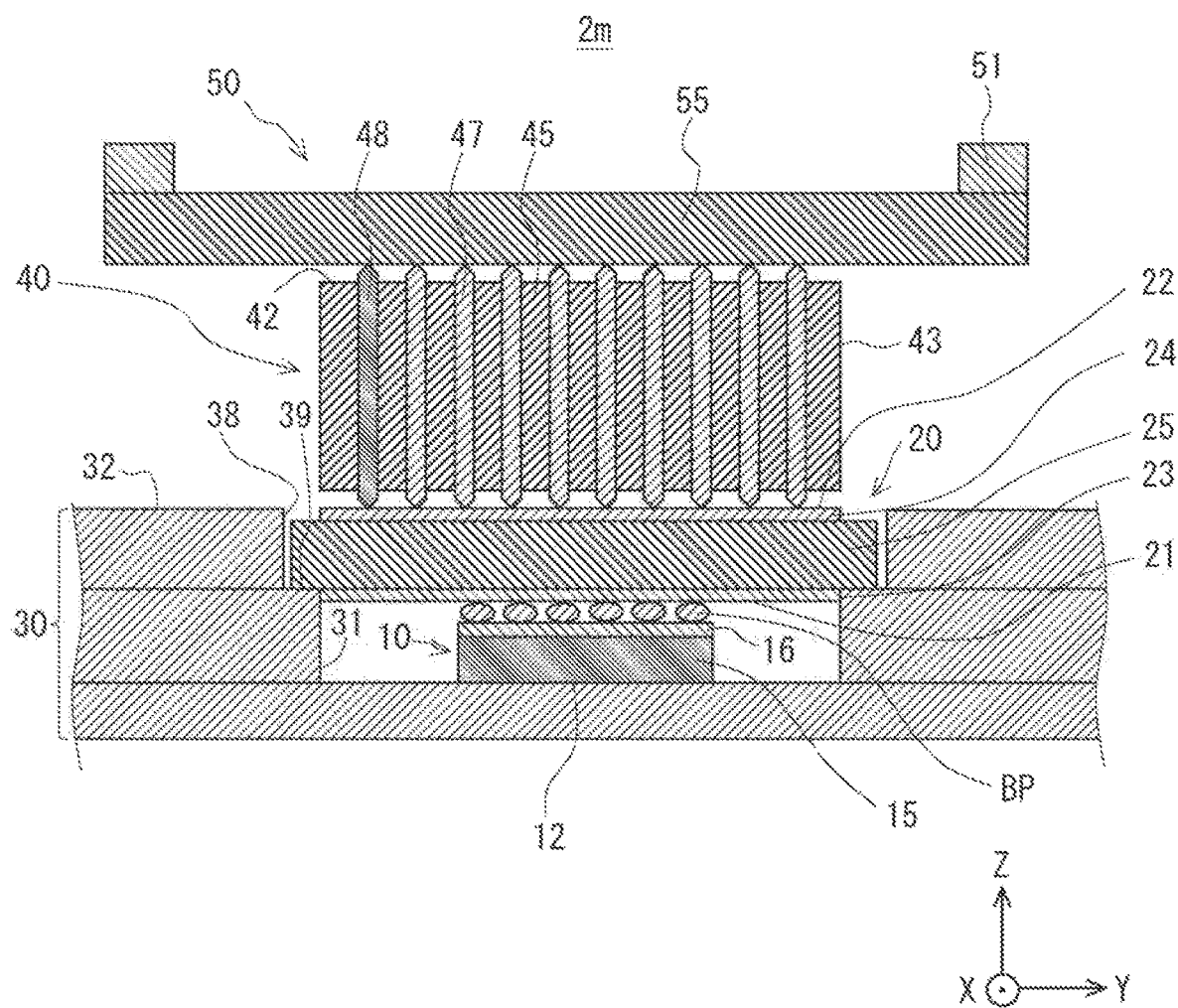
FIG. 18 is a cross-sectional view showing an example of a quantum device according to a thirteenth modified example of the second example embodiment.
Figure 19:
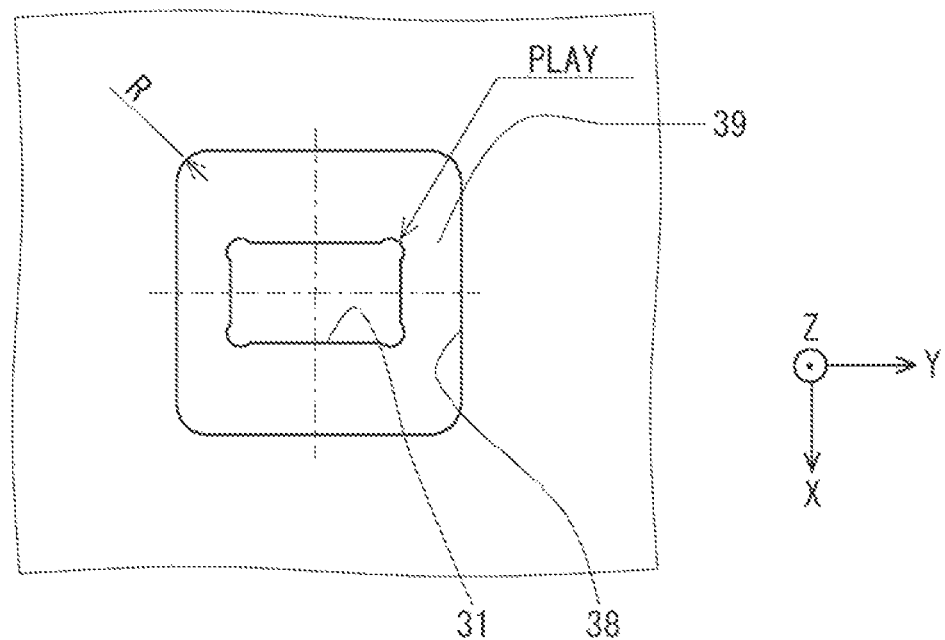
FIG. 19 is a plan view showing the example of the recessed part and a countersunk part of a sample stage according to the thirteenth modified example of the second example embodiment.

Next, a thirteenth modified example of the second example embodiment will be described. In this modified example, a countersunk part is formed in the recessed part 31. FIG. 18 is a cross-sectional view showing an example of a quantum device according to a thirteenth modified example of the second example embodiment. FIG. 19 is a plan view showing an example of the recessed part 31 and the countersunk part of the sample stage 30 according to the thirteenth modified example of the second example embodiment. As shown in FIGS. 18 and 19, in the quantum device 2m, the recessed part 31 of the sample stage 30 is formed in a predetermined surface 32 of the sample stage 30. Further, a countersunk part 38 is formed around the mouth of the recessed part 31. As a result, a stepped surface 39 having a step (i.e., a difference in level) with respect to the predetermined surface 32 is formed around the mouth of the recessed part 31. Therefore, the countersunk part 38 includes the stepped surface 39.

The stepped surface 39 is, for example, parallel to the predetermined surface 32. The stepped surface 39 is formed around the recessed part 31. The stepped surface 39 surrounds the recessed part 31. The quantum chip 10 is disposed inside the recessed part 31. A part of the mounting surface 21 of the interposer 20 is in contact with the stepped surface 39.

An insulating film may be formed in the part of the interposer 20 that is in contact with the stepped surface 39 of the mounting surface 21 in order to prevent electrical conduction with the stepped surface 39. Further, no interposer wiring layer 23 may be formed in the part of the mounting surface 21 that is in contact with the stepped surface 39.

As shown in FIG. 19, a space is formed around the four sides of the recessed part 31 so that the quantum chip 10 can be placed therein. Further, the recessed part 31 may have such a shape that a circular part or an R-part is added to each of the four corners thereof. In this way, it is possible to prevent a stress and a strain from occurring due to the volume changes during the cooling to an extremely low temperature. In particular, it is possible to prevent the stress from being concentrated at the four corners which would otherwise be caused when the corners have right angles or acute angles.

In the quantum device 2m according to this modified example, since the interposer 20 is disposed inside the countersunk part 38, the interposer 20 is surrounded by the sample stage 30. Therefore, the cooling performance can be improved. Further, since a part of the mounting surface 21 of the interposer 20 is in contact with the stepped surface 39, the cooling performance can also be improved by this feature. Further, it is possible to reduce the step (i.e., the difference in level) between the predetermined surface 32 and the opposite surface 22, and thereby to improve the degree of flexibility as to how the quantum device 2m is placed.

FOURTEENTH MODIFIED EXAMPLE

Figure 20:
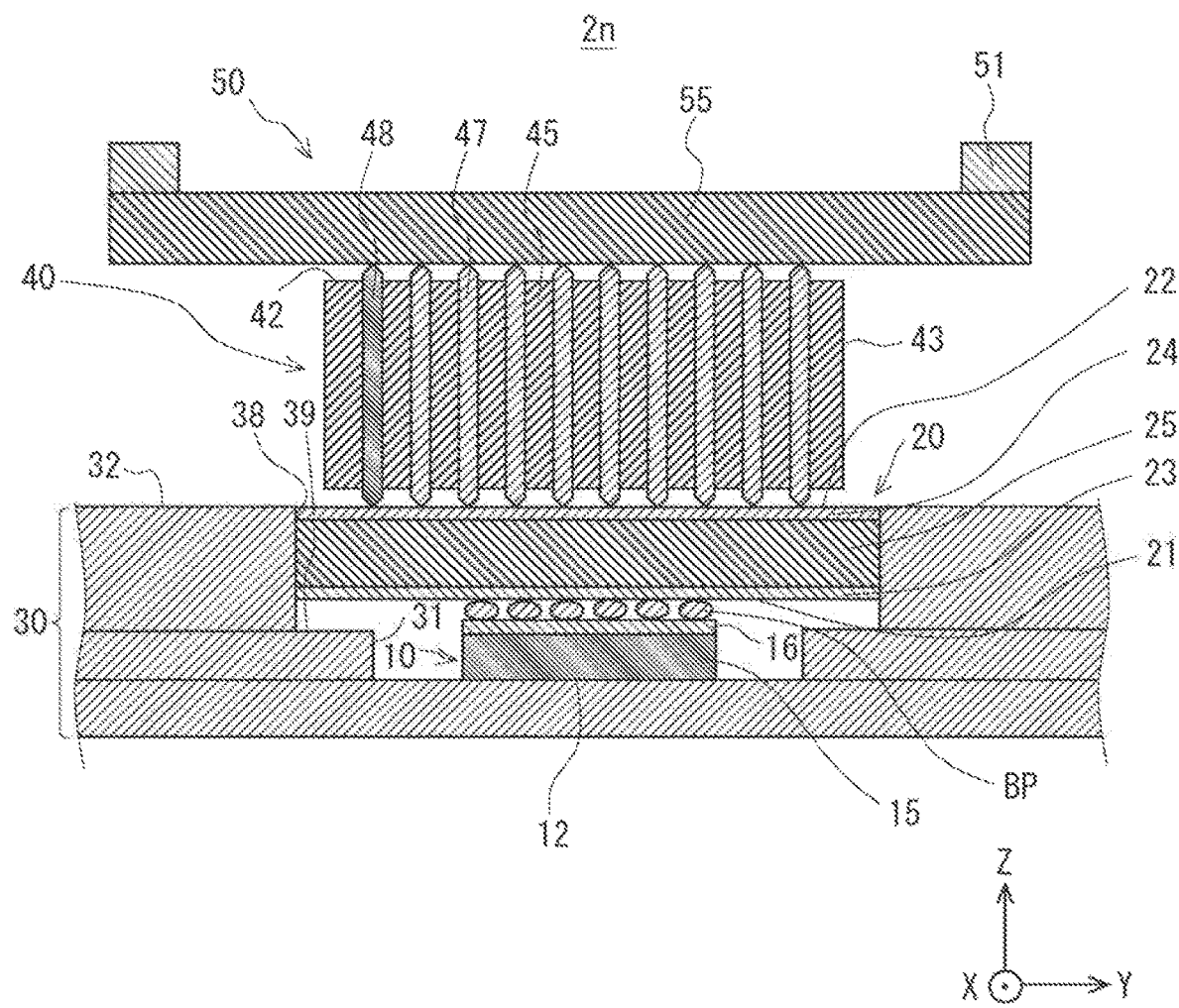
FIG. 20 is a cross-sectional view showing an example of a quantum device according to a fourteenth modified example of the second example embodiment.

Next, a fourteenth modified example of the second example embodiment will be described. In a quantum device according to this modified example, the interposer 20 is in contact with the side surface of the countersunk part 38. FIG. 20 is a cross-sectional view showing an example of a quantum device according to the fourteenth modified example of the second example embodiment. As shown in FIG. 20, in the quantum device 2n, the recessed part 31 of the sample stage 30 is formed in a predetermined surface 32 of the sample stage 30. Further, the countersunk parts 38 are formed around the mouth of the recessed part 31. As a result, a stepped surface 39 having a step with respect to the predetermined surface 32 is formed around the mouth of the recessed part 31.

In the quantum device 2n according to this modified example, at least a part of the side surface of the interposer 20 is in contact with the side surface of the countersunk part 38 that is located between the stepped surface 39 and the predetermined surface 32. Further, a part of the mounting surface 21 of the interposer 20 is disposed in such a manner that a space is formed between the part of the mounting surface 21 and the stepped surface 39. In this way, since the mounting surface 21 of the interposer 20 does not have to be in contact with the sample stage 30, it is possible to make full use of the mounting surface 21.

FIFTEENTH MODIFIED EXAMPLE

Figure 21:
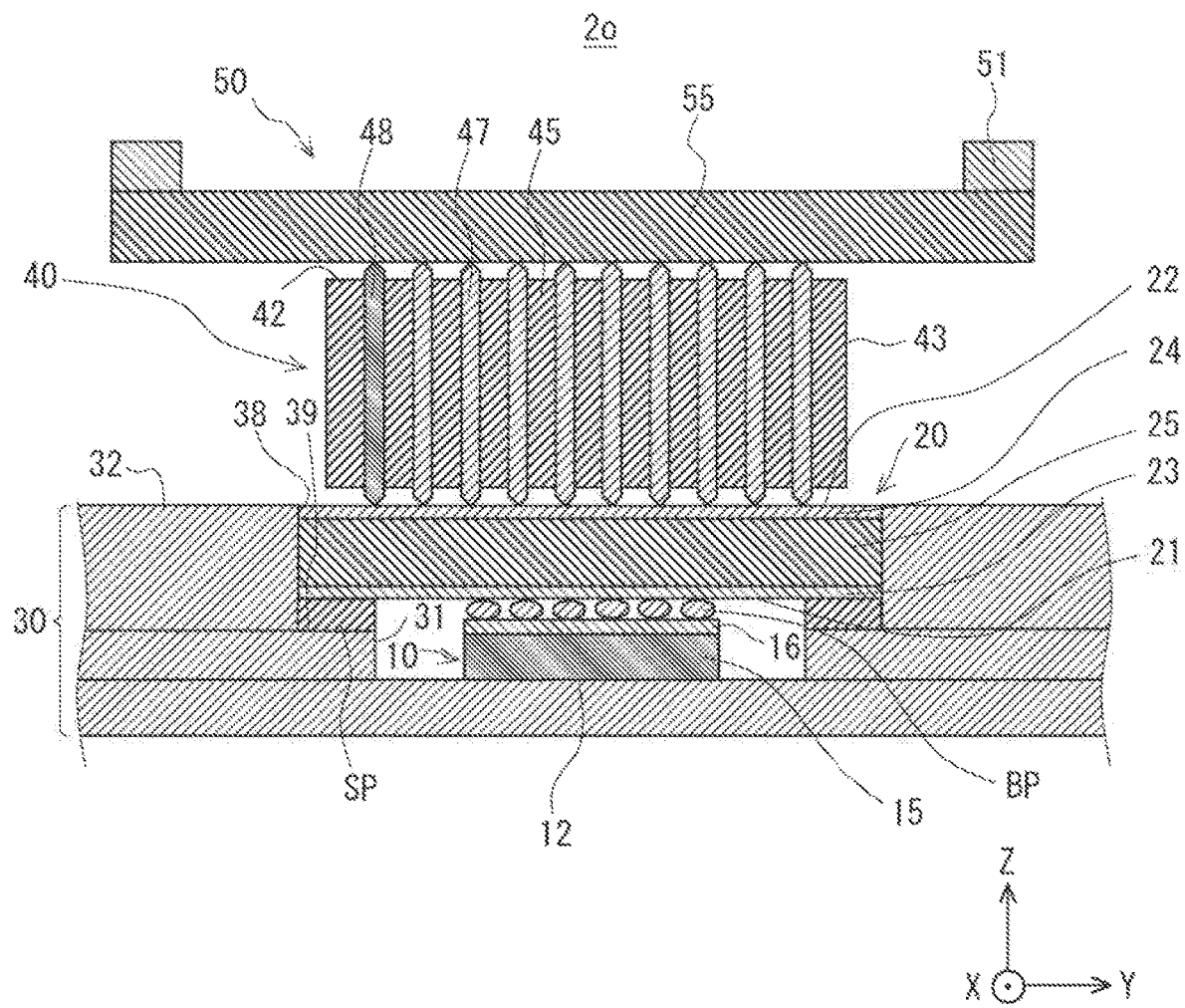
FIG. 21 is a cross-sectional view showing an example of a spacer according to a fifteenth modified example of the second example embodiment.

Next, a fifteenth modified example of the second example embodiment will be described. This modified example includes a spacer between the mounting surface 21 of the interposer 20 and the stepped surface 39. FIG. 21 is a cross-sectional view showing an example of a spacer according to the fifteenth modified example of the second example embodiment. As shown in FIG. 21, in a quantum device 2o, a part of the mounting surface 21 of the interposer 20 is disposed in such a manner that a spacer SP is interposed between that part of the mounting surface 21 and the stepped surface 39. That is, the spacer SP is disposed between the mounting surface 21 and the stepped surface 39. The spacer SP preferably contains an insulating material having high thermal conductivity, such as aluminum nitride, silicon carbide, sapphire, silicon, and alumina.

Since the quantum device 2o includes the spacer SP, it is possible to improve the stability of the mounted quantum chip 10 and thereby to improve the accuracy of the position thereof. Further, the thermal connection with the sample stage 30 can be improved. Further, it is possible to make full use of the mounting surface 21 by forming the interposer wiring layer 23 thereon.

SIXTEENTH MODIFIED EXAMPLE

Figure 22:
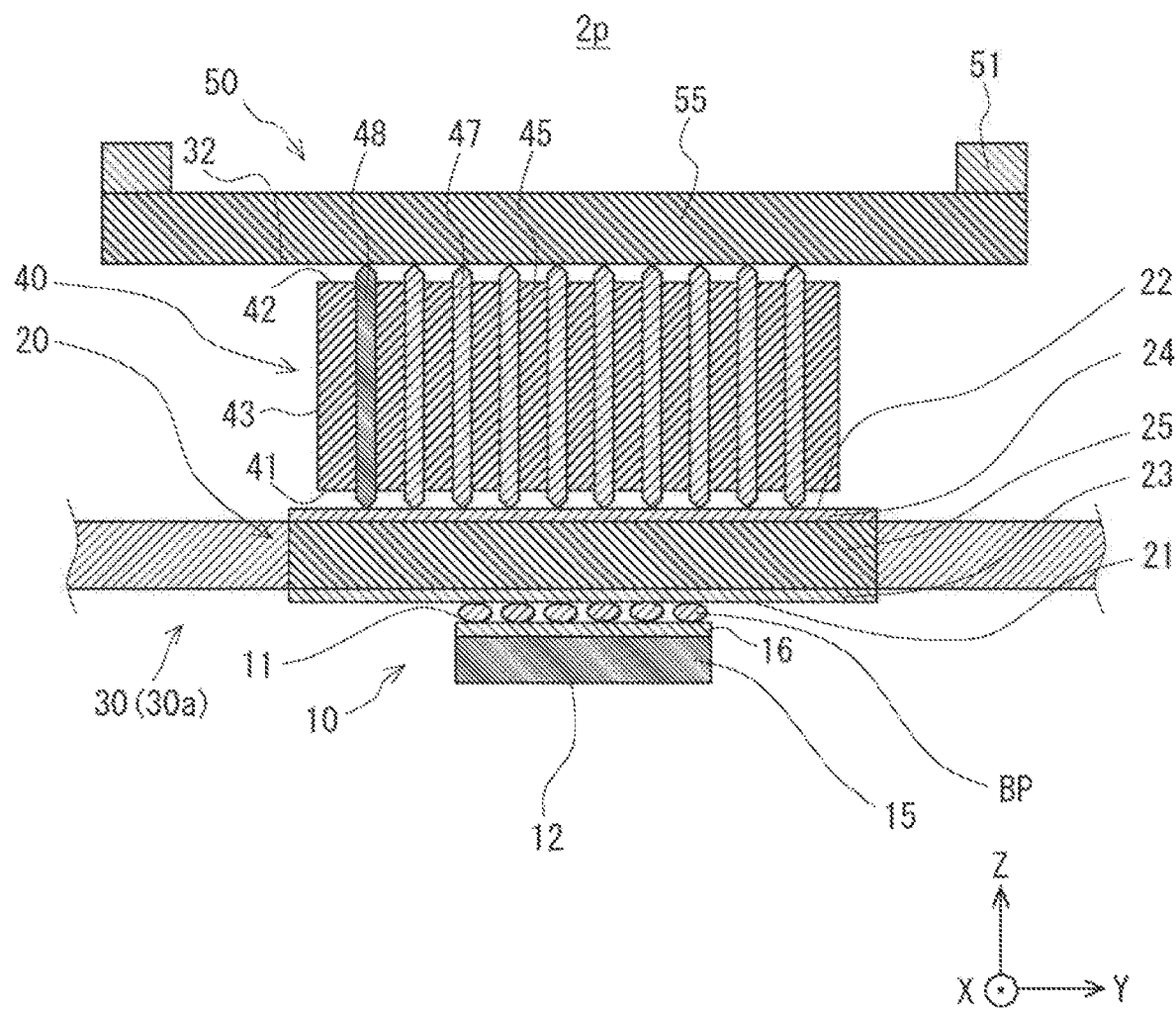
FIG. 22 is a cross-sectional view showing an example of a quantum device according to a sixteenth modified example of the second example embodiment.

Next, a sixteenth modified example of the second example embodiment will be described. In this modified example, only a part of the interposer 20 is in contact with the sample stage 30. FIG. 22 is a cross-sectional view showing an example of a quantum device according to the sixteenth modified example of the second example embodiment. As shown in FIG. 22, in the quantum device 2p, the side surface of the interposer 20 is in contact with a sample stage 30 having a cooling function. The sample stage 30 includes, for example, plate-like parts 30a. The plate-like parts 30a sandwich the interposer 20 on its side surfaces.

In the quantum device 2p, the interposer 20 is used as a heat flow path. Therefore, the quantum device 2p can be cooled by thermal conduction to the side surfaces of the interposer 20. Further, it is possible to make full use of the mounting surface 21 and the opposite surface 22 of the interposer 20 for the terminal(s).

SEVENTEENTH MODIFIED EXAMPLE

Figure 23:
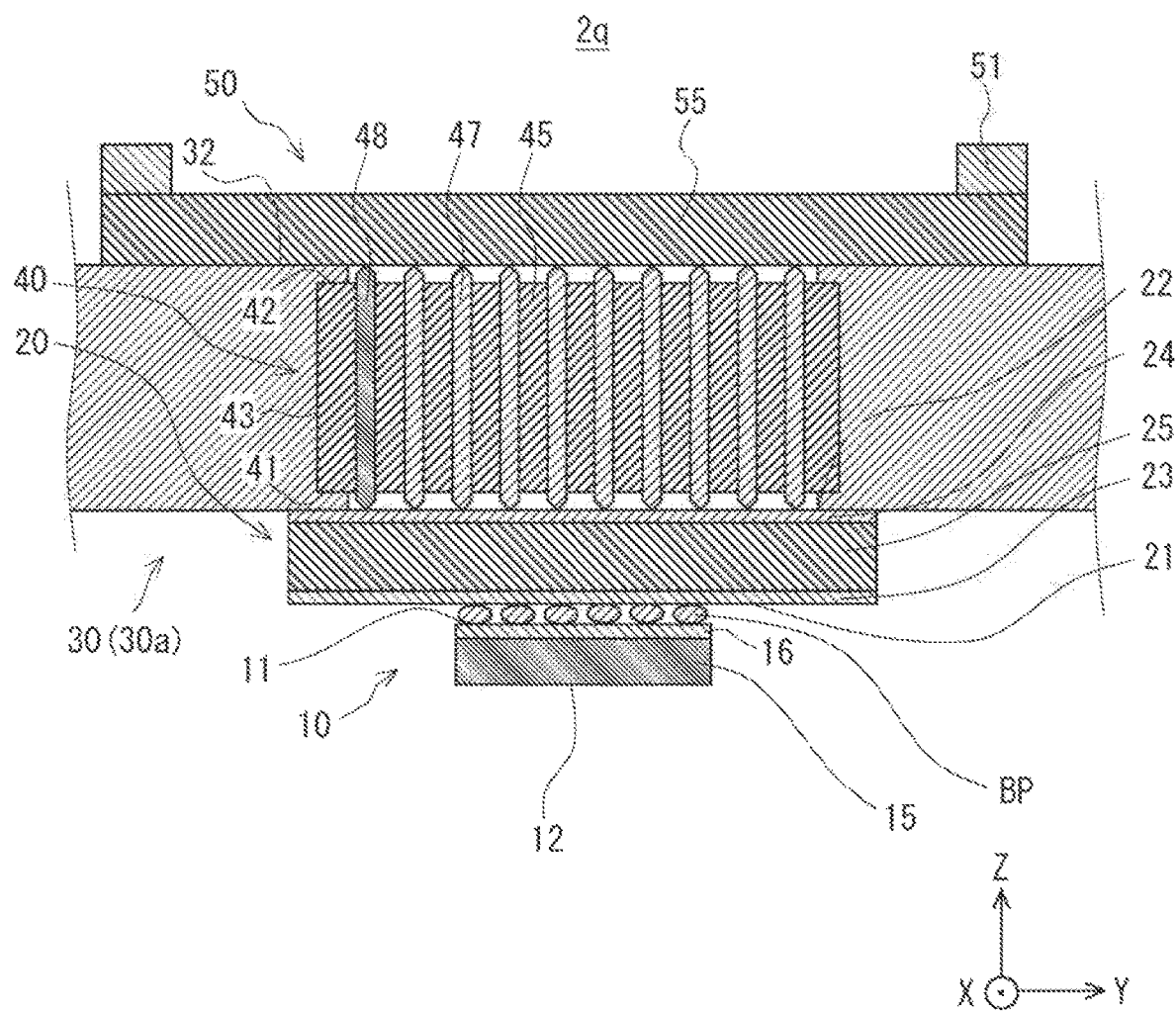
FIG. 23 is a cross-sectional view showing an example of a quantum device according to a seventeenth modified example of the second example embodiment.

Next, a seventeenth modified example of the second example embodiment will be described. In this modified example, only a part of the socket 40 is in contact with the sample stage 30. FIG. 23 is a cross-sectional view showing an example of a quantum device according to the seventeenth modified example of the second example embodiment. As shown in FIG. 23, in the quantum device 2q, the side surface 43 of the housing 45 is in contact with the sample stage 30 having the cooling function. The sample stage 30 includes, for example, a plate-like parts 30a. The plate-like parts 30a sandwich the housing 45 on its side surfaces 43. Note that, in the quantum device 2q, in addition to or instead of the side surface 43 of the housing 45, a part of the one end surface 41 of the housing 45 may be in contact with the sample stage 30, and/or a part of the other end surface 42 of the housing 45 may be in contact with the sample stage 30.

In the quantum device 2q, since a part of at least one of the one end surface 41, the other end surface 42, and the side surface 43 of the housing 45 is in contact with the sample stage 30 having the cooling function, it is possible to cool the quantum device 2q by thermal conduction to the sample stage 30. In this way, the cooling performance of the quantum device 2q can be improved. Two or more of the first to seventeenth modified examples of the second example embodiment may be combined with one another as desired.

THIRD EXAMPLE EMBODIMENT

Figure 24:
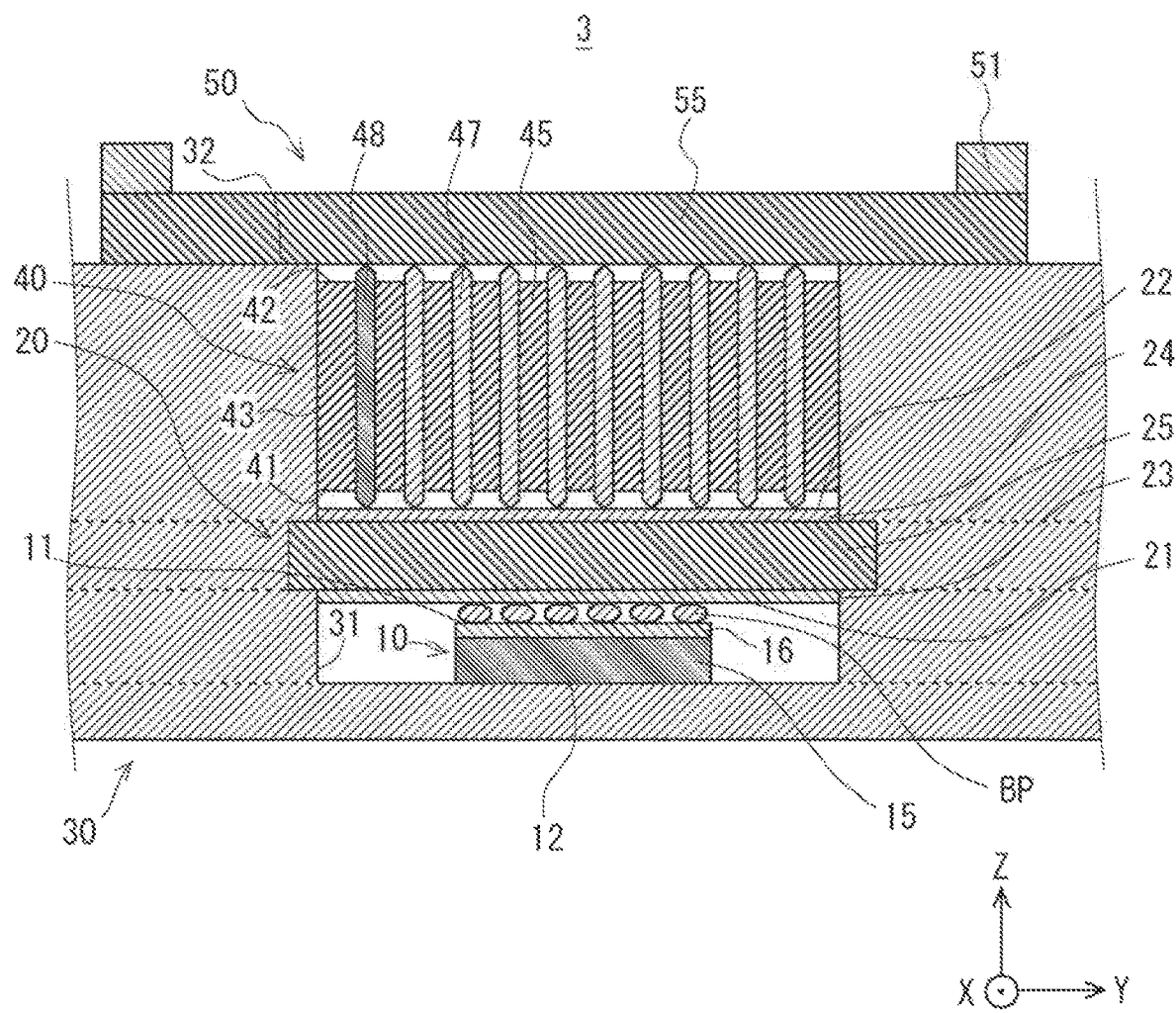
FIG. 24 is a cross-sectional view showing an example of a quantum device according to a third example embodiment.

Next, a quantum device according to a third example embodiment will be described. In this example embodiment, each of at least a part of the quantum chip 10, at least a part of the interposer 20, and at least a part of the socket 40 is in contact with the sample stage 30 having the cooling function. FIG. 24 is a cross-sectional view showing an example of a quantum device according to the third example embodiment.

As shown in FIG. 24, in the quantum device 3, at least a part of the quantum chip 10, at least a part of the interposer 20, and at least a part of the socket 40 are in contact with the sample stage 30. Specifically, for example, the quantum chip 10, the interposer 20, and the socket 40 are disposed inside the recessed part 31 of the sample stage 30. Further, the second surface 12 of the quantum chip 10, the side surface of the interposer 20, and the side surface 43 of the socket 40 are in contact with the inner surface of the recessed part 31 of the sample stage 30. Note that at least one of a part of the mounting surface 21 and the opposite surface 22 of the interposer 20 and a part of the one end surface 41 and the other end surface 42 of the socket 40 may be in contact with the inner surface of the recessed part 31 of the sample stage 30.

In the quantum device 3, since each of a part of the quantum chip 10, a part of the interposer 20, and a part of the socket 40 is in contact with the sample stage 30, the cooling performance of the quantum device 3 can be improved. The rest of the configuration and the advantageous effects have been already described in the descriptions of the first and second example embodiments.

FOURTH EXAMPLE EMBODIMENT

Figure 25:
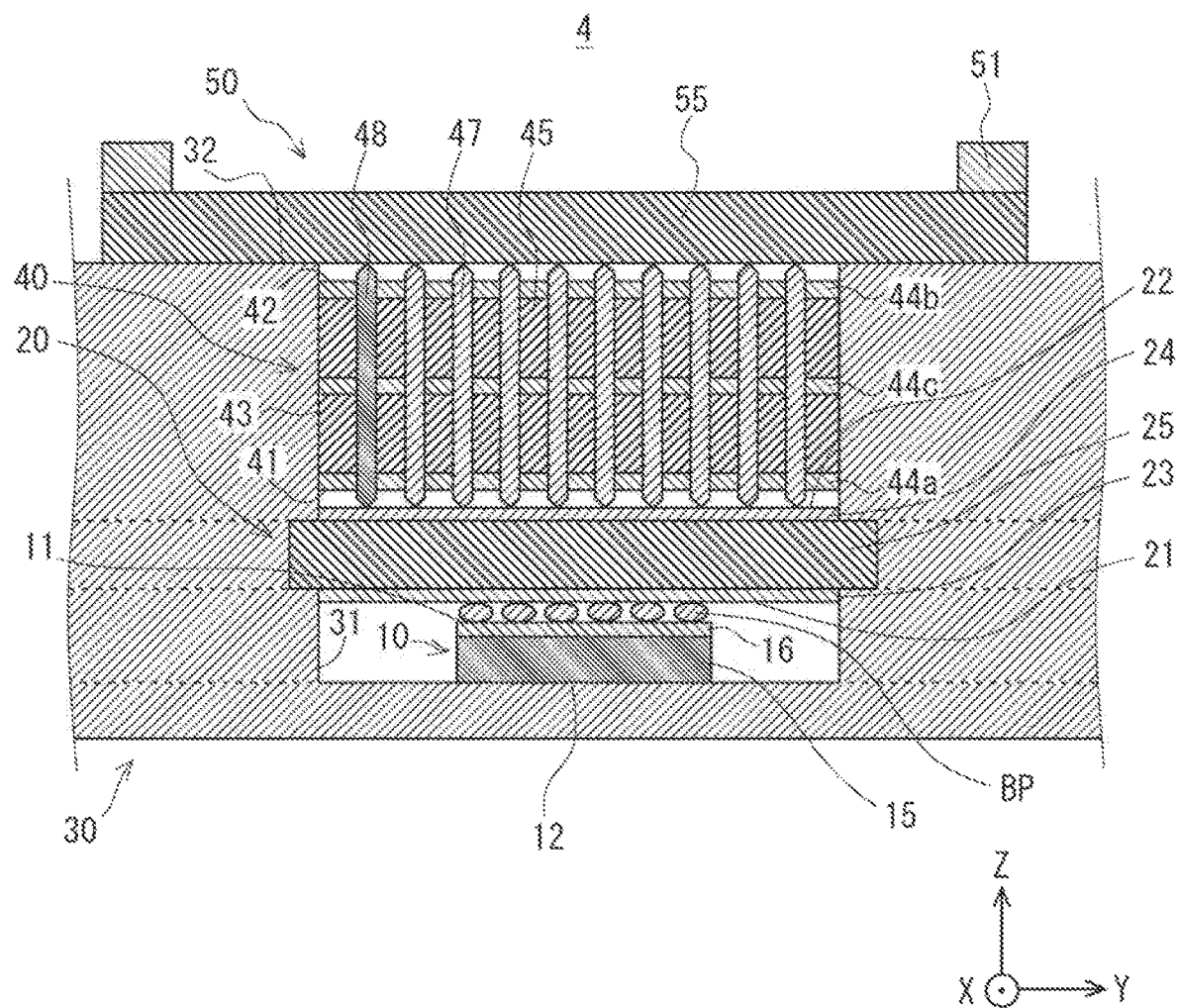
FIG. 25 is a cross-sectional view showing an example of a quantum device according to a fourth example embodiment.

Next, a quantum device according to a fourth example embodiment will be described. A socket 40 according to this example embodiment includes a heat dissipation layer that is in contact with the sample stage 30. FIG. 25 is a cross-sectional view showing an example of a quantum device according to the fourth example embodiment. As shown in FIG. 25, in the quantum device 4, the socket 40 includes heat dissipation layers 44a, 44b and 44c that are in contact with the sample stage 30 having the cooling function.

The heat dissipation layer 44a and the like preferably contain a material having high thermal conductivity. The heat dissipation layer 44a and the like may contain the above-described superconducting material. The heat dissipation layer 44a and the like may contain the same superconducting material as that contained in the wiring layer 16 and the like, and/or a superconducting material different from that contained in the wiring layer 16 and the like. Further, the heat dissipation layer 44a and the like may contain the above-described normal conductive material. The heat dissipation layer 44a and the like may contain the same normal conductive material as that contained in the interposer wiring layer 24 and the like, and/or a normal conductive material different from that contained in the interposer wiring layer 24 and the like. Further, the heat dissipation layer 44a and the like may contain ceramic having high thermal conductivity such as aluminum nitride. When the heat dissipation layer 44a and the like contain a conductive material, they are preferably covered with an insulating film(s) in order to maintain insulation from the movable pins 47.

The heat dissipation layer 44a is disposed on the one end surface 41 of the housing 45. Therefore, the heat dissipation layer 44a is exposed to the one end surface 41. The heat dissipation layer 44b is disposed on the other end surface 42 of the housing 45. Therefore, the heat dissipation layer 44b is exposed to the other end surface 42. The heat dissipation layer 44c is disposed at the center of the housing 45 and is parallel to the XY-plane. The heat dissipation layer 44c is exposed to the side surface 43 of the housing 45. At least one of the heat dissipation layers 44a, 44b and 44c may be provided in the quantum device 4.

The heat dissipation layers 44a, 44b and 44c may be in contact with the sample stage 30. For example, the heat dissipation layers 44a, 44b and 44c are in contact with the inner surface of the recessed part 31 of the sample stage 30. As described above, the socket 40 includes a heat dissipation layer(s) that is exposed to at least one of the one end surface 41, the other end surface 42, and the side face 43 of the housing 45, and is in contact with the sample stage 30.

In the quantum device 4, since the socket 40 includes the heat dissipation layers 44a, 44b and 44c, the cooling performance of the quantum device 4 can be improved. When the heat dissipation layers 44a, 44b and 44c are in contact with the sample stage 30, the cooling performance of the quantum device 4 can be improved even further. The rest of the configuration and the advantageous effects have been already described in the descriptions of the first to third example embodiments.

FIFTH EXAMPLE EMBODIMENT

Figure 26:
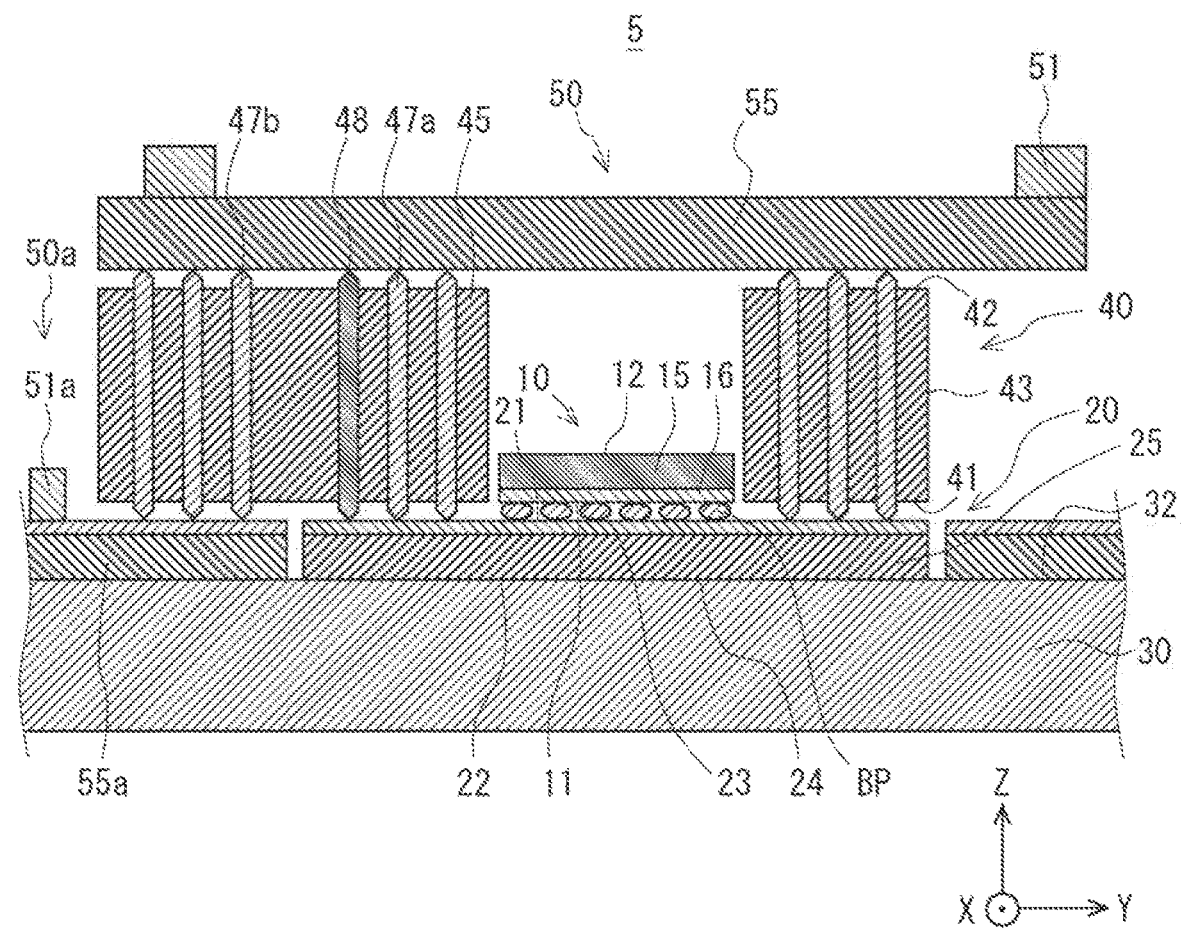
FIG. 26 is a cross-sectional view showing an example of a quantum device according to a fifth example embodiment.

Next, a quantum device according to a fifth example embodiment will be described. A socket 40 in this example embodiment is disposed on the mounting surface 21 of the interposer 20. FIG. 26 is a cross-sectional view showing an example of a quantum device according to the fifth example embodiment.

As shown in FIG. 26, in the quantum device 5, the socket 40 is disposed on the mounting surface 21 of the interposer 20. Therefore, the socket 40 is disposed on the mounting surface 21 side of the interposer 20 on which the quantum chip 10 is disposed. Note that, in FIG. 26, the direction perpendicular to the mounting surface 21 is defined as a Z-axis direction. Further, the mounting surface 21 side is defined as a Z-axis positive direction and the opposite surface 22 side is defined as a Z-axis negative direction. For the explanatory purpose, the Z-axis positive direction side is referred to as upward and the Z-axis negative direction side is referred to as downward. Therefore, in the quantum device 4 according to this example embodiment, the socket 40 is disposed above (on the Z-axis positive direction side of) the interposer 20.

The opposite surface 22 of the interposer 20 may be in contact with the sample stage 30. In this way, it is possible to cool the quantum chip 10 through the interposer 20. Note that the ground potential of at least one of the quantum chip 10 and the interposer 20 may be obtained from the sample stage 30 through the TVs 26 of the interposer 20.

The socket 40 is disposed around the quantum chip 10 so as to avoid the quantum chip 10, such as being disposed in a square frame shape or in a U-shape, as viewed from the Z-axis positive direction side. One end of each movable pin 47 is in electrical contact with a terminal on the mounting surface 21 of the interposer 20. The one end of the movable pin 47 is movable relative to the housing 45. The other end of each movable pin 47 is in electrical contact with a terminal on a board 50 on which a connector 51 that serves as an external input/output is formed.

The board 50 is disposed so as to be opposed to the other end surface 42 of the socket 40 as in the case of the previously-described example embodiments. In this example embodiment, a board 50a may be disposed side by side with the interposer 20 on the sample stage 30. The lower surface of a board substrate 55a of the board 50a is in contact with the sample stage 30. A connector(s) 51a and a terminal(s) are formed on the upper surface of the board substrate 55a. The socket 40 may be disposed over both the mounting surface 21 of the interposer 20 and the upper surface of the board 50a. Further, a plurality of terminals formed on the lower surface of the board 50 may be connected to each other. In such a case, a terminal formed on the mounting surface 21 of the interposer 20 may be connected to the connector 51a of the board 50a through one end of a movable pin 47a, the other end of the movable pin 47a, a terminal of the board 50, the other terminal of the board 50, the other end of a movable pin 47b, one end of the movable pin 47b, and the terminal of the board 50a in this order.

The boards 50 and 50a, on which connectors 51 and 51a serving as external inputs/outputs are respectively formed, receive/output electric power, signals, and the like from/to the quantum chip 10 through the socket 40 and the interposer 20.

According to the quantum device 5 in accordance with this example embodiment, it is possible to increase the number of connectors 51a serving as external input/outputs, and thereby increase the number of terminals for external connection. Further, since the opposite surface 22 of the interposer 20 can be in contact with the sample stage 30, the cooling performance of the quantum device 5 can be improved. The rest of the configuration and the advantageous effects have been already described in the descriptions of the first to fourth example embodiments.

Although the present disclosure is described above with reference to example embodiments, the present disclosure is not limited to the above-described example embodiments and various modifications can be made within the scope and spirit of the present disclosure. For example, a combination of any two or more of the configurations of the first to fifth example embodiments, a configuration in which a plurality of quantum chips 10 are connected to one interposer 20, and a configuration in which a plurality of interposers 20 are connected to one socket 40 are also included in the scope of the technical idea according to the example embodiments.

The whole or part of the example embodiments disclosed above can be described as, but not limited to, the following supplementary notes.
(Supplementary Note 1)
A quantum device comprising:
a quantum chip;
an interposer on which the quantum chip is mounted; and a socket disposed so as to be opposed to the interposer, the socket comprising a movable pin and a housing supporting the movable pin, wherein at least one end of the movable pin, which includes the one end and the other end opposite to the one end, is movable relative to the housing, the one end being in electrical contact with a terminal of the interposer, and the other end is in an electrical contact with a terminal of a board on which a connector is formed, the connector being configured to serve as an external input/output.

(Supplementary Note 2)

The quantum device described in Supplementary note 1, wherein a part of at least one of the quantum chip, the interposer, and the socket is in contact with a sample stage having a cooling function.

(Supplementary Note 3)

The quantum device described in Supplementary note 1, wherein the quantum chip is disposed inside a recessed part formed in a sample stage having a cooling function, and a part of the interposer is in contact with the sample stage.

(Supplementary Note 4)

The quantum device described in Supplementary note 3, wherein the quantum chip comprises a first surface and a second surface opposite to the first surface, the first surface being a surface that is opposed to the interposer when the quantum chip is mounted on the interposer, and at least a part of the second surface is in contact with an inner surface of the recessed part.

(Supplementary Note 5)

The quantum device described in Supplementary note 3, wherein the quantum chip comprises a first surface and a second surface opposite to the first surface, the first surface being a surface that is opposed to the interposer when the quantum chip is mounted on the interposer, and at least a part of the second surface is bonded or joined to an inner surface of the recessed part.

(Supplementary Note 6)

The quantum device described in Supplementary note 3, wherein the quantum chip comprises a first surface and a second surface opposite to the first surface, the first surface being a surface that is opposed to the interposer when the quantum chip is mounted on the interposer, and the second surface is disposed in such a manner that a space is formed between the second surface and an inner surface of the recessed part.

(Supplementary Note 7)

The quantum device described in Supplementary note 3, wherein the quantum chip comprises a first surface and a second surface opposite to the first surface, the first surface being a surface that is opposed to the interposer when the quantum chip is mounted on the interposer, and the second surface is in contact with a movable chip pin, the movable chip pin being configured so as to protrude beyond a bottom of the recessed part.

(Supplementary Note 8)

The quantum device described in any one of Supplementary notes 3 to 7, wherein the recessed part is formed in a predetermined surface of the sample stage, and a part of a mounting surface of the interposer on which the quantum chip is mounted is in contact with the predetermined surface.

(Supplementary Note 9)

The quantum device described in Supplementary note 8, wherein at least a part of a side surface of the interposer is in contact with a plurality of pressing members provided on the predetermined surface.

(Supplementary Note 10)

The quantum device described in Supplementary note 9, wherein the interposer has a rectangular shape as viewed in a direction perpendicular to the mounting surface, and flat-surface parts of the plurality of pressing members press parts of side surfaces of the interposer near respective corners thereof.

(Supplementary Note 11)

The quantum device described in any one of Supplementary notes 3 to 10, wherein the interposer comprises a mounting surface on which the quantum chip is mounted, and an opposite surface opposite to the mounting surface, and the opposite surface is in contact with a cooling member having a cooling function.

(Supplementary Note 12)

The quantum device described in any one of Supplementary notes 3 to 11, wherein the interposer comprises a mounting surface on which the quantum chip is mounted, and an opposite surface opposite to the mounting surface, and the interposer comprises an interposer substrate, and a thermal via extending from a mounting surface side of the interposer substrate to an opposite surface side thereof.

(Supplementary Note 13)

The quantum device described in Supplementary note 12, wherein the thermal via comprises a tapered part in which a diameter on the opposite surface side is larger than that on the mounting surface side.

(Supplementary Note 14)

The quantum device described in Supplementary note 12 or 13, wherein the interposer further comprises a common connection member configured to connect a plurality of thermal vias to each other.

(Supplementary Note 15)

The quantum device described in any one of Supplementary notes 3 to 14, wherein the quantum chip comprises a quantum circuit in which a resonator is formed, the resonator comprising a loop circuit in which pieces of a superconducting material are connected to each other by a Josephson junction, a recess is formed at a bottom of the recessed part, and an area in which the quantum circuit is formed is contained in an area of the recess as viewed in a direction perpendicular to the first surface of the quantum chip, the first surface being the surface that is opposed to the interposer when the quantum chip is mounted on the interposer.

(Supplementary Note 16)

The quantum device described in Supplementary note 15, wherein the quantum chip is in contact with a pillar extending from a bottom of the recess in a direction perpendicular to the first surface.

(Supplementary Note 17)

The quantum device described in any one of Supplementary notes 3 to 14, wherein the quantum chip comprises a quantum circuit in which a resonator is formed, the resonator comprising a loop circuit in which pieces of a superconducting material are connected to each other by a Josephson junction, a through hole is formed at a bottom of the recessed part, and an area in which the quantum circuit is formed is contained in an area of the through hole as viewed in a direction perpendicular to the first surface of the quantum chip, the first surface being the surface that is opposed to the interposer when the quantum chip is mounted on the interposer.

(Supplementary Note 18)

The quantum device described in any one of Supplementary notes 3 to 17, wherein a side surface of the quantum chip is in contact with an inner surface of the recessed part.

(Supplementary Note 19)

The quantum device described in any one of Supplementary notes 3 to 18, wherein the recessed part is formed in a predetermined surface of the sample stage, and at least a part of a side surface of the interposer is in contact with an inner surface of the recessed part.

(Supplementary Note 20)

The quantum device described in any one of Supplementary notes 3 to 18, wherein the recessed part is formed in a predetermined surface of the sample stage, a stepped surface comprising a step with respect to the predetermined surface is formed around a mouth of the recessed part, and a part of a mounting surface of the interposer on which the quantum chip is mounted is in contact with the stepped surface.

(Supplementary Note 21)

The quantum device described in any one of Supplementary notes 3 to 18, wherein the recessed part is formed in a predetermined surface of the sample stage, a stepped surface comprising a step with respect to the predetermined surface is formed around a mouth of the recessed part, and at least a part of a side surface of the interposer is in contact with a side surface located between the stepped surface and the predetermined surface.

(Supplementary Note 22)

The quantum device described in Supplementary note 21, wherein a part of a mounting surface of the interposer on which the quantum chip is mounted is disposed in such a manner that a space is formed between the part of the mounting surface and the stepped surface.

(Supplementary Note 23)

The quantum device described in Supplementary note 21, wherein a part of a mounting surface of the interposer on which the quantum chip is mounted is disposed in such a manner that a spacer is interposed between the part of the mounting surface and the stepped surface.

(Supplementary Note 24)

The quantum device described in any one of Supplementary notes 3 to 23, wherein the interposer comprises a mounting surface on which the quantum chip is mounted, and an opposite surface opposite to the mounting surface, and the socket is disposed so as to be opposed to the opposite surface.

(Supplementary Note 25)

The quantum device described in Supplementary note 1 or 2, wherein the interposer comprises a mounting surface on which the quantum chip is mounted, and an opposite surface opposite to the mounting surface, and the socket is mounted on the mounting surface.

(Supplementary Note 26)

The quantum device described in any one of Supplementary notes 1 to 25, wherein at least a part of the quantum chip, at least a part of the interposer, and at least a part of the socket are in contact with a sample stage having a cooling function.

(Supplementary Note 27)

The quantum device described in any one of Supplementary notes 1 to 26, wherein the housing comprises one end surface from which the one end of the movable pin protrudes, the other end surface from which the other end of the movable pin protrudes, and a side surface connecting a peripheral edge of the one end surface with a peripheral edge of the other end surface, and a part of at least one of the one end surface, the other end surface, and the side surface is in contact with a sample stage having a cooling function.

(Supplementary Note 28)

The quantum device described in Supplementary note 27, wherein the socket comprises a heat dissipation layer, the heat dissipation layer being exposed to at least one of the one end surface, the other end surface, and the side surface of the housing, and being in contact with the sample stage.

(Supplementary Note 29)

The quantum device described in any one of Supplementary notes 1 to 28, wherein the socket comprises a positioning pin by which the position of the socket is determined.

(Supplementary Note 30)

A quantum device comprising:

a quantum chip;

an interposer on which the quantum chip is mounted; and a socket disposed so as to be opposed to the interposer, the socket comprising a movable pin and a housing supporting the movable pin, the movable pin being in electrical contact with a terminal of the interposer, wherein a part of at least one of the quantum chip, the interposer, and the socket is in contact with a sample stage having a cooling function.

According to the present disclosure, it is possible to provide a quantum device capable of preventing terminals for external connection from being disconnected (e.g., from being broken) and thereby securing the terminals for external connection.

The first to fifth embodiments can be combined as desirable by one of ordinary skill in the art.

While the disclosure has been particularly shown and described with reference to embodiments thereof, the disclosure is not limited to these embodiments. It will be understood by those of ordinary skill in the art that various changes in form and details may be made therein without departing from the spirit and scope of the present disclosure as defined by the claims.

What is claimed is:

1. A quantum device comprising:
   a quantum chip;
   an interposer on which the quantum chip is mounted; and
   a socket disposed so as to be opposed to the interposer, the socket comprising a movable pin and a housing supporting the movable pin, wherein
   at least one end of the movable pin, which includes the one end and another end opposite to the one end, is movable relative to the housing, the one end being in electrical contact with a terminal of the interposer,
   the other end is in electrical contact with a terminal of a board on which a connector is formed, the connector being configured to serve as an external input/output, the interposer comprises a mounting surface on which the quantum chip is mounted, and an opposite surface opposite to the mounting surface, and the socket is disposed so as to be opposed to the opposite surface.

2. The quantum device according to claim 1, wherein a part of at least one of the quantum chip, the interposer, and the socket is in contact with a sample stage having a cooling function.

3. The quantum device according to claim 1, wherein
the quantum chip is disposed inside a recessed part formed in a sample stage having a cooling function, and
a part of the interposer is in contact with the sample stage.

4. The quantum device according to claim 3, wherein
the quantum chip comprises a first surface and a second surface opposite to the first surface, the first surface being a surface that is opposed to the interposer when the quantum chip is mounted on the interposer, and
at least a part of the second surface is in contact with an inner surface of the recessed part.

5. The quantum device according to claim 3, wherein
the quantum chip comprises a first surface and a second surface opposite to the first surface, the first surface being a surface that is opposed to the interposer when the quantum chip is mounted on the interposer, and
at least a part of the second surface is bonded or joined to an inner surface of the recessed part.

6. The quantum device according to claim 3, wherein
the quantum chip comprises a first surface and a second surface opposite to the first surface, the first surface being a surface that is opposed to the interposer when the quantum chip is mounted on the interposer, and
the second surface is disposed in such a manner that a space is formed between the second surface and an inner surface of the recessed part.

7. The quantum device according to claim 3, wherein
the quantum chip comprises a first surface and a second surface opposite to the first surface, the first surface being a surface that is opposed to the interposer when the quantum chip is mounted on the interposer, and
the second surface is in contact with a movable chip pin, the movable chip pin being configured so as to protrude beyond a bottom of the recessed part.

8. The quantum device according to claim 3, wherein
the recessed part is formed in a predetermined surface of the sample stage, and
a part of a mounting surface of the interposer on which the quantum chip is mounted is in contact with the predetermined surface.

9. The quantum device according to claim 8, wherein at least a part of a side surface of the interposer is in contact with a plurality of pressing members provided on the predetermined surface.

10. The quantum device according to claim 9, wherein
the interposer has a rectangular shape as viewed in a direction perpendicular to the mounting surface, and
flat-surface parts of the plurality of pressing members press parts of side surfaces of the interposer near respective corners thereof.

11. The quantum device according to claim 3, wherein
the interposer comprises a mounting surface on which the quantum chip is mounted, and an opposite surface opposite to the mounting surface, and
the opposite surface is in contact with a cooling member having a cooling function.

12. The quantum device according to claim 3, wherein
the interposer comprises a mounting surface on which the quantum chip is mounted, and an opposite surface opposite to the mounting surface, and
the interposer comprises an interposer substrate, and a thermal via extending from a mounting surface side of the interposer substrate to an opposite surface side thereof.

13. The quantum device according to claim 12, wherein the thermal via comprises a tapered part in which a diameter on the opposite surface side is larger than that on the mounting surface side.

14. The quantum device according to claim 12, wherein the interposer further comprises a common connection member configured to connect a plurality of thermal vias to each other.

15. The quantum device according to claim 3, wherein
the quantum chip comprises a quantum circuit in which a resonator is formed, the resonator comprising a loop circuit in which pieces of a superconducting material are connected to each other by a Josephson junction,
a recess is formed at a bottom of the recessed part, and
an area in which the quantum circuit is formed is contained in an area of the recess as viewed in a direction perpendicular to the first surface of the quantum chip, the first surface being the surface that is opposed to the interposer when the quantum chip is mounted on the interposer.

16. The quantum device according to claim 15, wherein the quantum chip is in contact with a pillar extending from a bottom of the recess in a direction perpendicular to the first surface.

17. The quantum device according to claim 3, wherein
the quantum chip comprises a quantum circuit in which a resonator is formed, the resonator comprising a loop circuit in which pieces of a superconducting material are connected to each other by a Josephson junction,
a through hole is formed at a bottom of the recessed part, and
an area in which the quantum circuit is formed is contained in an area of the through hole as viewed in a direction perpendicular to the first surface of the quantum chip, the first surface being the surface that is opposed to the interposer when the quantum chip is mounted on the interposer.

18. The quantum device according to claim 1, wherein
the housing comprises one end surface from which the one end of the movable pin protrudes, the other end surface from which the other end of the movable pin protrudes, and a side surface connecting a peripheral edge of the one end surface with a peripheral edge of the other end surface, and
a part of at least one of the one end surface, the other end surface, and the side surface is in contact with a sample stage having a cooling function.

19. The quantum device according to claim 18, wherein the socket comprises a heat dissipation layer, the heat dissipation layer being exposed to at least one of the one end surface, the other end surface, and the side surface of the housing, and being in contact with the sample stage.

* * * * *